(12) United States Patent
Hirakata et al.

(10) Patent No.: US 7,220,603 B2
(45) Date of Patent: May 22, 2007

(54) METHOD FOR MANUFACTURING DISPLAY DEVICE AND MANUFACTURING APPARATUS

(75) Inventors: Yoshiharu Hirakata, Kanagawa (JP); Kaoru Tsuchiya, Kanagawa (JP); Tomoyuki Iwabuchi, Kanagawa (JP); Teruyuki Fujii, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 228 days.

(21) Appl. No.: 10/941,687

(22) Filed: Sep. 15, 2004

(65) Prior Publication Data
US 2005/0095740 A1   May 5, 2005

(30) Foreign Application Priority Data
Sep. 19, 2003   (JP)   ............................. 2003-329008

(51) Int. Cl.
*H01L 21/00* (2006.01)
(52) U.S. Cl. ................. 438/5; 438/10; 438/12
(58) Field of Classification Search .................... 438/4, 438/10, 13, 12, 14, 17, 5, 7
See application file for complete search history.

(56) References Cited

U.S. PATENT DOCUMENTS

| | | | |
|---|---|---|---|
| 4,725,558 A | 2/1988 | Yamazaki et al. ............. 437/2 |
| 4,806,496 A | 2/1989 | Suzuki et al. .................. 437/4 |
| 4,951,041 A | 8/1990 | Inada et al. ................. 340/767 |
| 5,414,443 A | 5/1995 | Kanatani et al. ............... 345/95 |
| 5,552,678 A | 9/1996 | Tang et al. ............... 315/169.3 |
| 5,641,991 A | 6/1997 | Sakoh ......................... 257/755 |
| 5,744,818 A | 4/1998 | Yamazaki et al. ............. 257/57 |
| 5,882,761 A | 3/1999 | Kawami et al. .............. 428/69 |
| 5,990,629 A | 11/1999 | Yamada et al. .......... 315/169.3 |
| 6,087,245 A | 7/2000 | Yamazaki et al. .......... 438/486 |
| 6,380,689 B1 | 4/2002 | Okuda ..................... 315/169.3 |
| 6,777,249 B2 * | 8/2004 | Yamazaki ...................... 438/4 |
| 6,909,111 B2 * | 6/2005 | Yamagata et al. ............. 257/59 |
| 2002/0042152 A1 | 4/2002 | Yamazaki et al. ............. 438/4 |
| 2005/0001830 A1 | 1/2005 | Osame et al. |
| 2005/0017928 A1 | 1/2005 | Osame et al. |

FOREIGN PATENT DOCUMENTS

JP   2002-190390   7/2002

* cited by examiner

*Primary Examiner*—Kevin M. Picardat
(74) *Attorney, Agent, or Firm*—Cook, Alex, McFarron, Manzo, Cummings & Mehler, Ltd.

(57) ABSTRACT

It is an object of the present invention to provide a method of manufacturing a display device, which can display images favorably by insulating a short-circuit portion between an anode and a cathode. Further, it is another object of the invention to provide a method of manufacturing a display device, which can prevent intrusion of moisture so as to inhibit deterioration of a light emitting element when the short-circuit portion between the anode and the cathode is insulated. Specifically, the invention provide a method of manufacturing a display device, wherein a reverse bias voltage is applied to the light emitting element including an electro-luminescent material between the anode and the cathode so as to insulate the short-circuit portion between the anode and the cathode at a temperature of from −40° C. to 8° C., more preferably, from −25° C. to 8° C.

10 Claims, 14 Drawing Sheets

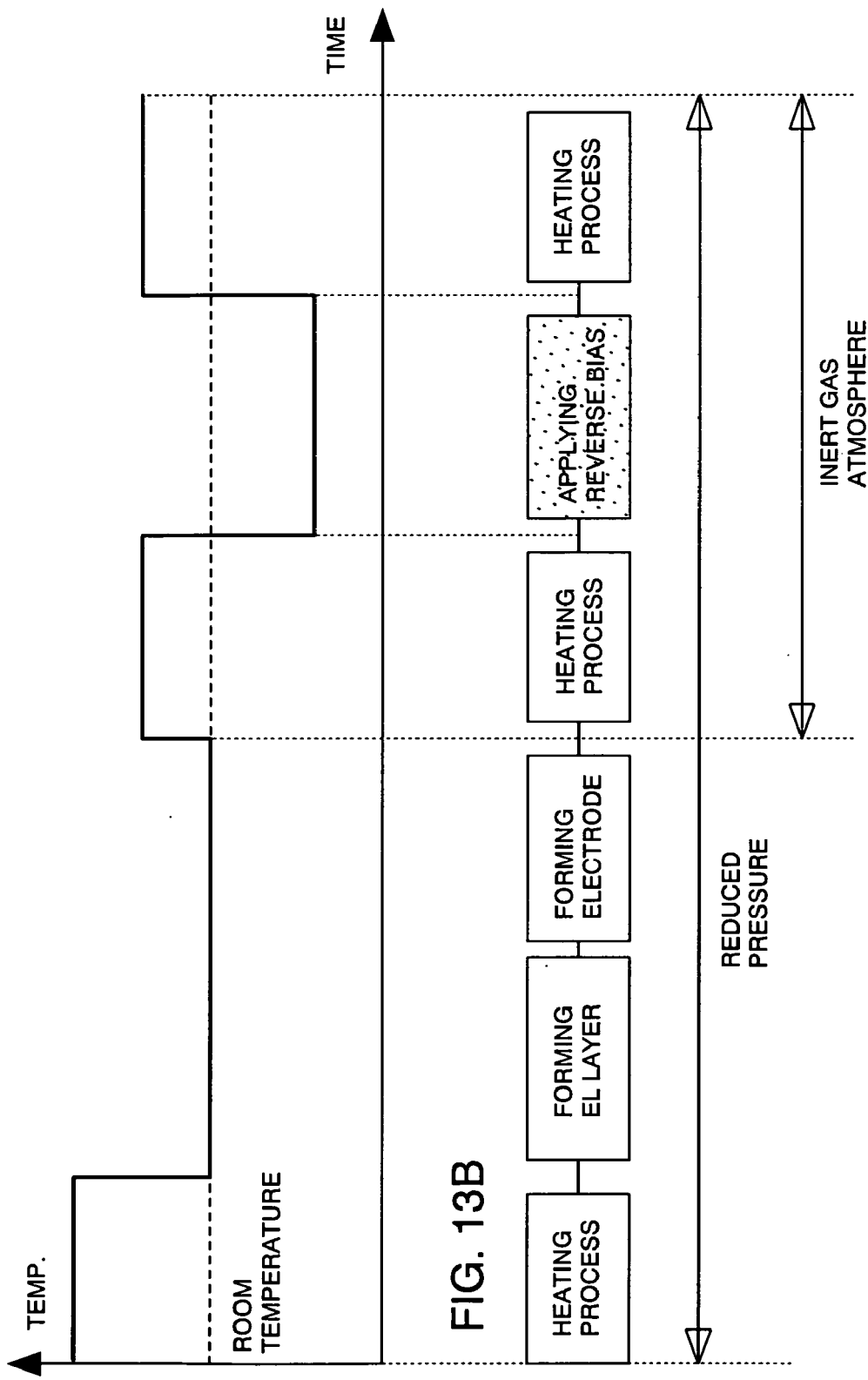

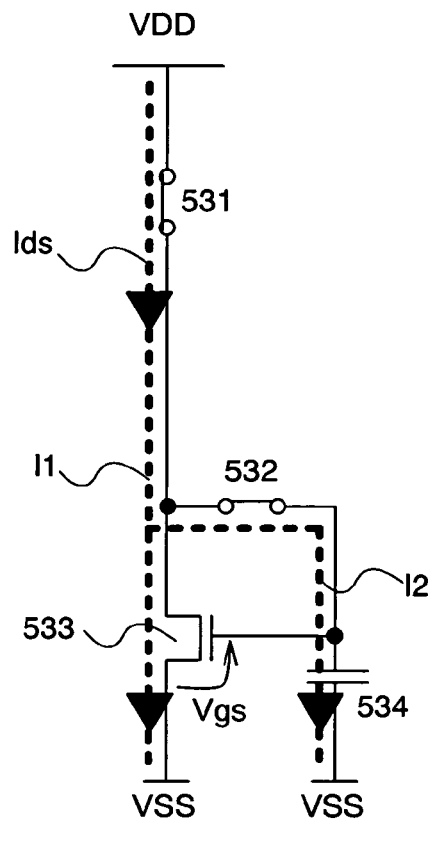
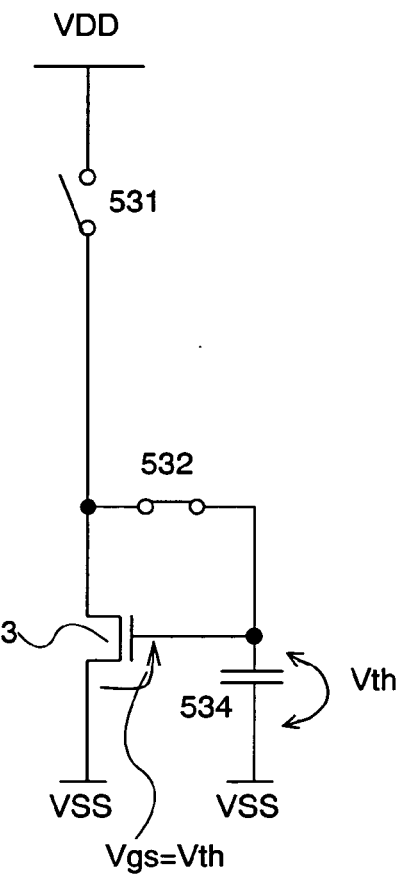
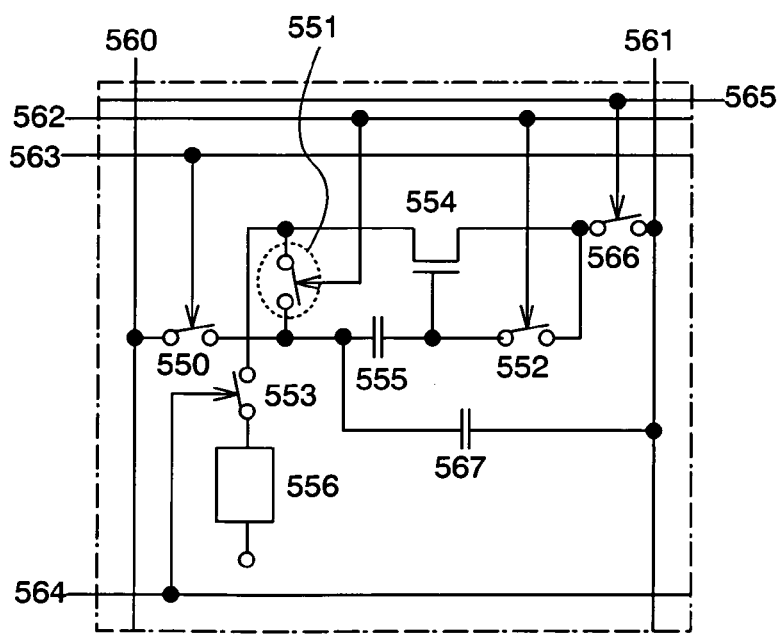

METHOD FOR MANUFACTURING DISPLAY DEVICE AND MANUFACTURING APPARATUS

BACKGROUND OF THE INVENTION

1. Field of the Invention

The present invention relates to a method of manufacturing a display device having a light emitting element. The present invention further relates to a manufacturing apparatus for a display device.

2. Description of Related Art

In recent years, a display device using a light emitting element, which is represented by an electro-luminescence (EL) element and the like, has been researched and developed as substitute for a liquid crystal display device. The display device has such advantages as high definition, wide viewing angle, thinness, and lightness because of the self-luminous type. By making use of these benefits, the display device has been expected to be applied to various fields. The light emitting element has a structure in which one layer or a plurality of layers composed of various materials (hereinafter referred to as an electro-luminescent layer) is interposed between a pair of electrodes.

FIG. 11A shows a cross sectional structure of a light emitting layer 22 in which an electro-luminescent layer 11 is interposed between an anode 10 and a cathode 12. The light emitting element 22 has four short-circuit portions 13 to 16. In the short-circuit portions 13 and 14, the anode 10 is shorted to the cathode 12 since an extraneous substance (waste) 17 is adhered to the anode 10. In the short-circuit portion 15, the anode 10 is shorted to the cathode 12 since a pin hole is formed in the electro-luminescent layer 11 due to the formation of a microscopic projection in the anode 10 when the anode is formed. In the short-circuit portion 16, the anode 10 is shorted to the cathode 12 since a pin hole is caused in the electro-luminescent layer 11 due to an uneven surface of the electro-luminescent layer 11.

FIGS. 11B and 11C are top views of a pixel portion 102, wherein a plurality of pixels 101, each of which includes a light emitting element 22, is arranged in matrix. When the short-circuit portions 15 and 16 are formed in several pixels 101 or the extraneous substance 17 is adhered to several pixels 101 in the pixel portion 102 as shown in the drawings, the short-circuit portions are formed between the anode and the cathode such that a current path 24 is formed in each short-circuit portion as illustrated an equivalent circuit diagram of FIG. 11D. In the pixels where such defects are caused, light emission and non-light emission of the pixels are not carried out according to signals. Accordingly, a phenomenon in which an entire device does not emit light since almost all the electric current flows through the short-circuit portions can be caused. Or, a phenomenon in which light emission or non-light emission of a certain pixel is not performed can be caused. These phenomena result in a problem, in which images are not favorably displayed. Therefore, there is a method of manufacturing and repairing a display device, which can display images favorably (see patent document 1). [Patent Document 1] Japanese Patent Application Laid-Open No. 2002-190390

The light emitting element is deteriorated due to various factors. As substances for promoting the deterioration of the light emitting element, for example, moisture is cited. In order to prevent the moisture from intruding into the light emitting element, a sealing treatment is generally carried out to the light emitting element under an inert gas atmosphere.

SUMMARY OF THE INVENTION

In view of the foregoing, it is an object of the present invention to provide a method of manufacturing a display device which can display images favorably by insulating a short-circuit portion between an anode and a cathode. Further, it is an object of the invention to provide a method of manufacturing a display device, which can prevent the intrusion of moisture so as to suppress the deterioration of a light emitting element when the short-circuit portion between the anode and the cathode is insulated. Furthermore, it is an object of the invention to provide a manufacturing apparatus which is capable of reducing fabrication time and manufacturing costs by continuously manufacturing the above-mentioned display device.

In order to overcome the problems set forth above in the related art, the invention provides following countermeasures.

According to one feature of the invention, the invention provide a method of manufacturing a display device, wherein a short-circuit portion between an anode and a cathode is insulated by applying a reverse bias voltage to a light emitting element including an electro-luminescent material between the anode and the cathode. The reverse bias voltage is applied to the light emitting element within room temperature minus 60° C. to 65° C., preferably within the temperature range of from −40° C. to 8° C., more preferably within the temperature range of from −25° C. to 8° C. When the reverse bias voltage is applied to the light emitting element, electric current locally flows only through the short-circuit portion between the anode and the cathode, and therefore the short-circuit portion generates heat. The short-circuit portion is oxidized or carbonized, and then insulated. At the same time, materials for the anode, the cathode, and the electro-luminescent layer are partly oxidized and then insulated. Accordingly, the short-circuit portion generates heat when the reverse bias voltage is applied to the light emitting element. However, moisture residing in an atmospheric air can intrude into the short-circuit portion, which promotes the deterioration of the light emitting element.

Since the reverse bias voltage is applied to the light emitting element at a temperature of from −40° C. to 8° C. in the invention, however, moisture exists in a solid state with a fixed shape and a fixed volume. That is, since moisture residing in the atmospheric air exists in a solid state, even if the short-circuit portion generates heat, the deterioration of the light emitting element can be prevented without being damaged from water penetration.

According to another feature of the invention, a heat treatment is carried out to the light emitting element prior to applying the reverse bias voltage to the light emitting element. According to another feature of the invention, a heat treatment is carried out to the light emitting element after applying the reverse bias voltage to the light emitting element. The heat treatment is performed at a temperature of 100° C. or more. The heat treatment performed prior to applying the reverse bias voltage to the light emitting element is effective in changing moisture, which resides in the atmospheric air, to a gaseous state. The heat treatment performed prior to applying the reverse bias voltage to the light emitting element is also effective for the purpose of preventing the moisture penetration into the light emitting element, which is caused by changing moisture from a solid state to a liquid state upon returning to a room temperature from a temperature of from −40° C. to 8° C.

After completing the light emitting element, the treatment for applying the reverse bias voltage to the light emitting element can be carried out at any time. In order to prevent the penetration of a substance, which promotes the deterioration of the light emitting element, however, it is preferable that the treatment for applying the reverse bias voltage to the light emitting element be performed after sealing the light emitting element. Further, since solid-state moisture is changed to a liquid or gaseous state in returning to the room temperature from the temperature of from −40° C. to 8° C., the reverse biased voltage is preferably applied to the light emitting element after sealing the light emitting element for the purpose of preventing the penetration of moisture. The sealing treatment for the light emitting element may be carried out by using any methods such as a method of mechanically sealing the light emitting element with a cover member; a method of sealing thereof with a thermosetting resin or a ultraviolet ray curable resin; and a method of sealing thereof with a thin film having a high barrier function such as metal oxide and nitride. Concretely, the state of sealing the light emitting element with the cover member corresponds to a state, which has a first substrate with the light emitting element formed thereon; a second substrate opposed to the first substrate; and a sealing agent for bonding the first and second substrates. At this moment, the second substrate may be formed of a glass substrate, a metal substrate, and the like.

Furthermore, the reverse bias voltage is preferably applied to the light emitting element at a time when a substrate with the light emitting element and a connection terminal formed thereon is sealed and has a adhesive tape being electrically connected to the connection terminal, i.e., at the time of mounting the adhesive tape typified by a TAB tape on the substrate. In this case, a signal for applying the reverse bias voltage can be easily supplied to the light emitting element via the adhesive tape. Furthermore, it is preferable that the reverse bias voltage be applied to the light emitting element in a testing step, which is performed immediately before the shipment of products.

After insulating the short-circuit portion between the anode and the cathode, the treatment for applying the reverse bias voltage to the light emitting element may be performed only once, or periodically. Further, the treatment for applying the reverse bias voltage to the light emitting element may be carried out so as to increase the potential difference between the anode and the cathode with time. When the reverse bias voltage is periodically applied to the light emitting element, it is possible to prevent the deterioration of the electro-luminescent layer around the short-circuit portion due to heat generated in the short-circuit portion, which is caused by applying the reverse bias voltage thereto.

According to another feature of the invention, a manufacturing apparatus includes: a film formation chamber for forming one or both of an electro-luminescent layer and an opposing electrode for a light emitting element over a first substrate; and a processing chamber for applying a reverse bias voltage to the light emitting element so as to insulate a short-circuit portion between an anode and a cathode, wherein the inside of the processing chamber is maintained at a temperature of from −40° C. to 8° C.

According to another feature of the invention, a manufacturing apparatus includes: a film formation chamber for forming one or both of an electro-luminescent layer and an opposing electrode for a light emitting element over a first substrate; a processing chamber for applying a reverse bias voltage to the light emitting element so as to insulate a short-circuit portion between an anode and a cathode; and a heating chamber for performing a heat treatment to the light emitting layer, wherein the inside of the processing chamber is maintained at a temperature of from −40° C. to 8° C.

The above-mentioned manufacturing apparatus may have a sealing chamber for adhering the first substrate to the second substrate with a sealing agent. Also, the manufacturing apparatus may have a bonding chamber for adhering the adhesive tape to the connection terminal formed over the first substrate. By utilizing the manufacturing apparatus having these chambers, treatments for more steps can be continuously carried out, thereby reducing the manufacturing time and manufacturing costs.

The invention having the above-described structures provides a method of manufacturing a display device which can display images favorably by insulating the short-circuit portion between the anode and the cathode. Further, the invention provides a method of manufacturing a display device which can prevent the ingress of moisture so as to inhibit deterioration of the light emitting element when the short-circuit portion between the anode and the cathode is insulated. In manufacturing the above-mentioned display device according to the invention, the display device can be subjected to plural treatments in succession, thereby reducing the manufacturing time and manufacturing costs.

BRIEF DESCRIPTION OF THE DRAWINGS

In the accompanying drawings:

FIGS. 13A and 13B are diagrams explaining a method of manufacturing a display device according to the invention; and FIGS. 14A to 14C are diagrams explaining a correction circuit for threshold voltage.

DETAILED DESCRIPTION OF THE INVENTION

Embodiment Mode 1

Figure 1A:
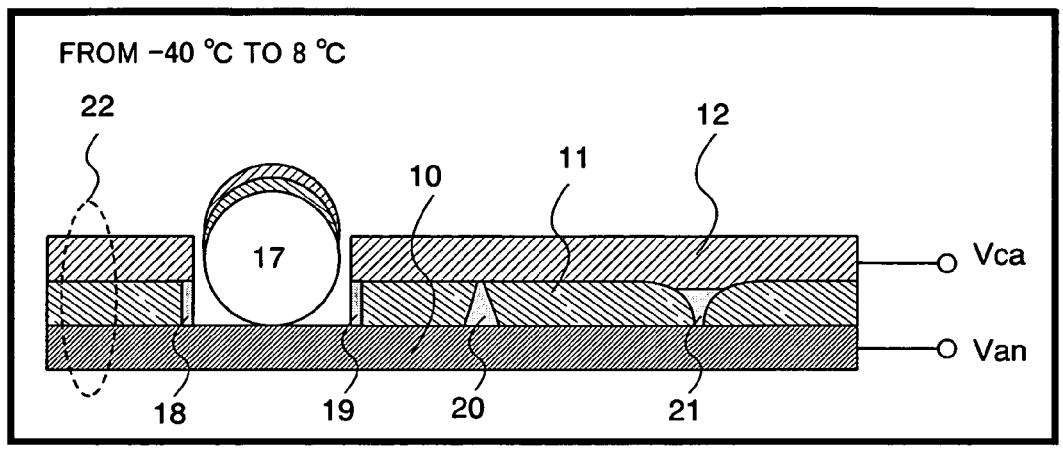
FIGS. 1A to 1D are diagrams for explaining a method of manufacturing a display device according to the present invention.
Figure 1B:
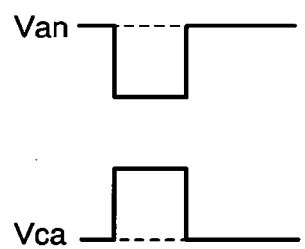
Figure 11A:
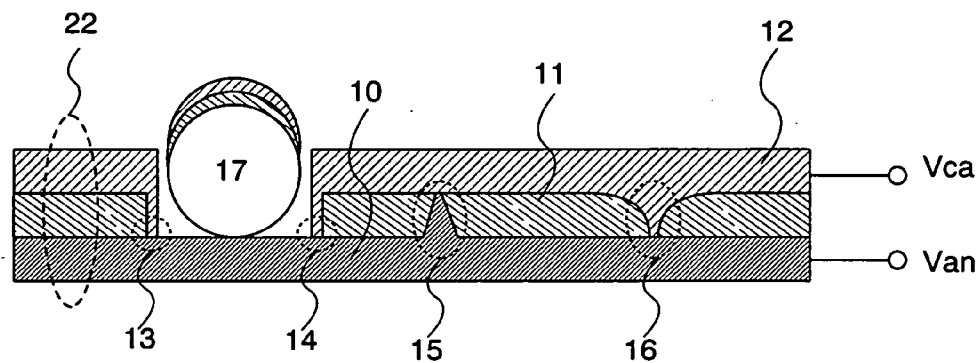
FIG. 11A is a cross sectional view.
Figure 11B:
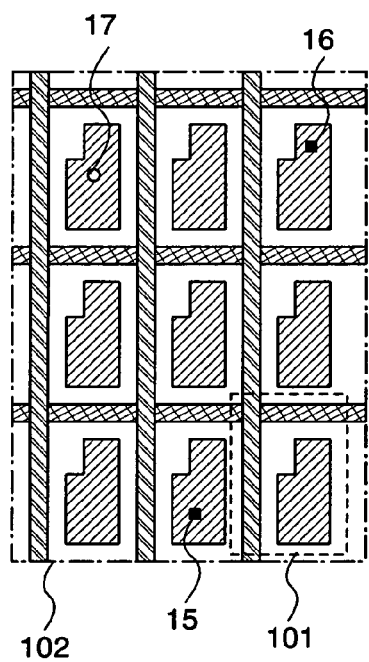
FIGS. 11B and 11C are top views.
Figure 11C:
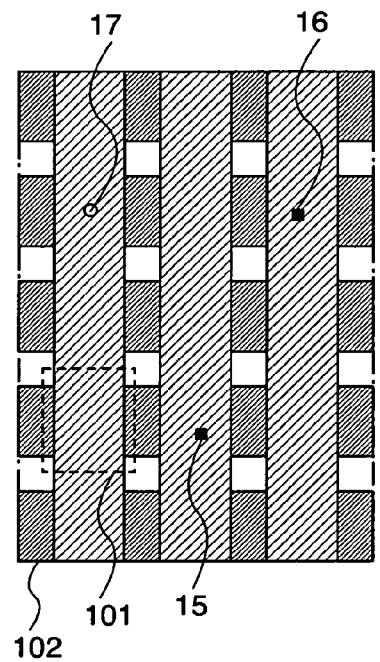

An embodiment mode of the present invention will be described with reference to FIGS. 1A to 1D. FIG. 1A shows a cross sectional structure of a light emitting element 22 in which a reverse bias voltage is applied thereto, i.e., a short-circuit portion of the light emitting element 22 is insulated. Meanwhile, FIG. 11A shows a cross sectional view of the light emitting element 22 before being applied with the reverse bias voltage. FIGS. 1B and 1D are timing charts. In FIGS. 1B and 1D, when the voltage applied to an anode 10 is Van and the voltage applied to a cathode 12 is Vca, the reverse bias voltage is applied to the anode 10 and the cathode 12 such that the voltage Vca becomes larger than the voltage Van; that is, each voltage satisfies a relational expression of Van<Vca. As depicted in FIG. 1B, the reverse bias voltage may be applied only once. Or, as depicted in FIG. 1D, the reverse bias voltage may be applied periodically so as to further increase the potential difference with time.

When the light emitting element 22 is applied with the reverse bias voltage, electric current locally flows only through the short-circuit portions, and therefore the short-circuit portions generate heat. The heated short-circuit portions are ultimately oxidized and carbonized, and then insulated. FIG. 1A shows a state in which insulators 18 to 21 are formed in each short-circuit portion. The respective insulators 18 to 21 are formed by oxidizing or carbonizing a part of materials constituting the anode 10 and the cathode 12. The application of the reverse bias voltage indicates a state in which electrons and holes are diffused in opposite directions from each other. In other words, it indicates a state in which electrons move toward the anode 10 and holes move toward the cathode 12; therefore, no carrier passes through each junction.

Figure 1C:
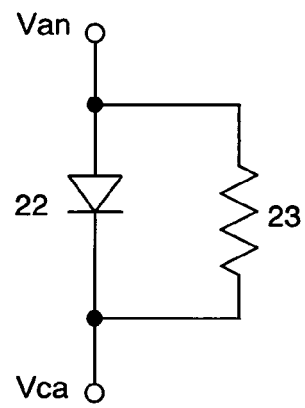
Figure 1D:
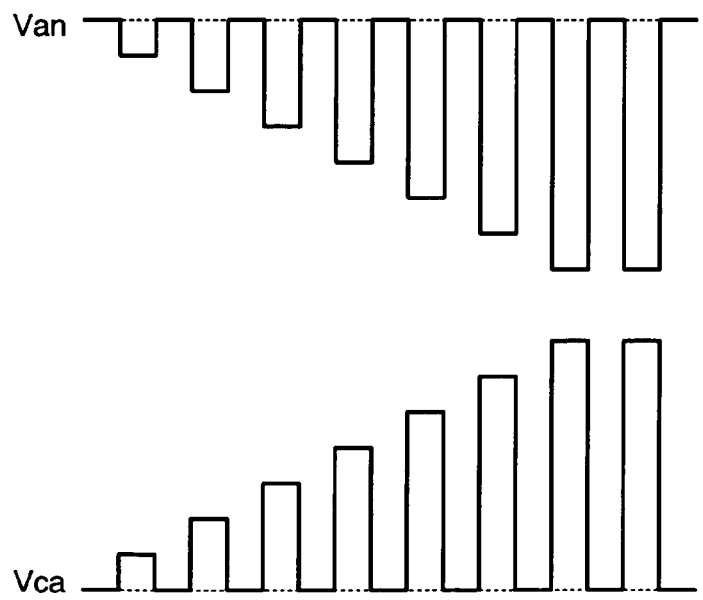
Figure 11D:
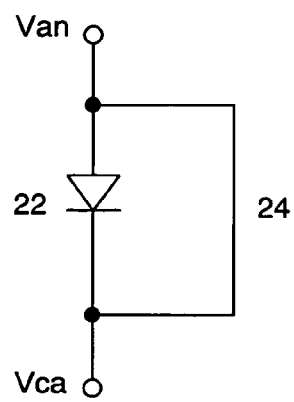
FIG. 11D is an equivalent circuit diagram for explaining a display device.

FIG. 1C is an equivalent circuit diagram of the light emitting element having a structure in which the insulators 18 to 21 are sandwiched between the anode 10 and the cathode 12. As illustrated in FIG. 1C, a resistive element 23 is disposed between the anode 10 and the cathode 12 of the light emitting element 22. The resistive element 23 corresponds to the insulators 18 to 21 in each short-circuit portion. As shown in FIG. 11D, before applying the reverse bias voltage to the light emitting element, the short-circuit portion between the anode 10 and the cathode 12 serves as a path 24. After applying the reverse bias voltage thereto, however, the short-circuit portion becomes the resistive element 23. When the short-circuit portion between the anode and the cathode becomes the resistive element 23, it is possible to prevent a phenomenon in which light emission or non-light emission of the light emitting element does not carried out according to signals; a phenomenon in which almost all electric current passes through the short-circuit portions and the entire device does not emit light; or a phenomenon in which a certain pixel element does not emit light. As a result, images can be favorably displayed.

It is preferable that the treatment for applying the reverse bias voltage to the light emitting element at a temperature of from −40° C. to 8° C. be performed immediately before shipping as a product after the light emitting element is formed over the substrate, the substrate with the light emitting element formed thereon is sealed with the sealing agent, and then the adhesive tape connecting to a driver IC is mounted over the substrate. Preferably, the reverse bias voltage is applied to the light emitting element immediately after sealing the light emitting element and before shipment.

By insulating the short-circuit portions between the anode and the cathode, the present invention comprising the above-mentioned structures can provide the method of manufacturing the display device, which is capable of displaying images favorably. In addition, it is possible to provide the method of manufacturing the display device, which is capable of preventing moisture to inhibit the deterioration of the light emitting element when the short-circuit portions between the anode and the cathode are insulated.

Embodiment Mode 2

Figure 2:
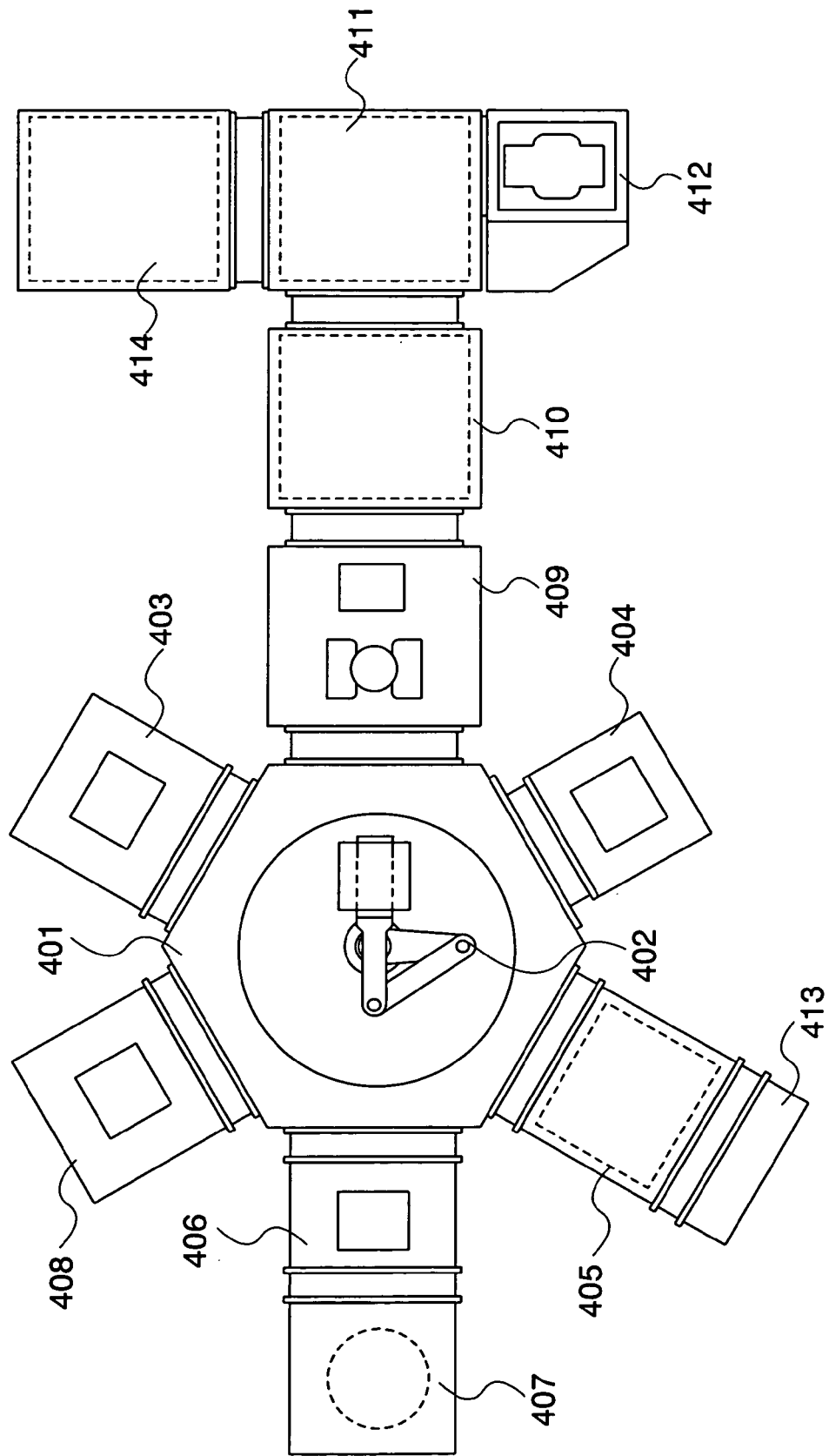
FIG. 2 is a diagram showing a manufacturing apparatus according to the invention.

An embodiment mode of the invention will be described with reference to FIG. 2. FIG. 2 shows a manufacturing apparatus comprising one or a plurality of chambers, i.e., a multi-chamber type manufacturing apparatus. The multi-chamber type manufacturing apparatus comprises a transporting chamber 401 including a transporting mechanism 402; a loading chamber 403; a pretreatment chamber 404; a film formation chamber 405; a material changing chamber 413; a vacuum evacuation chamber 406; a film formation chamber 407; a film formation chamber 408; a sealing chamber 409; a bonding chamber 410; processing chambers 414 and 411; and a delivery chamber 412.

One or a plurality of chambers selected from the plural chambers for the multi-chamber type manufacturing apparatus is maintained at a reduced pressure. In order to reduce the pressure inside the one or the plurality of chambers, evacuation pumps such as a dry pump, a mechanical booster pump, a turbomolecular pump (a magnetic levitation type), and a cryopump can be used. In order to obtain a high-vacuum state, it is preferable to use the magnetic levitation type turbomolecular pump.

In the embodiment mode, processing steps until the shipment will be explained as follows by way of example: a substrate with elements up to a transparent conductor, which corresponds to an anode of a light emitting element, formed thereon is prepared; a light emitting element is formed over the substrate; the light emitting element is sealed; a reverse bias voltage is applied to the light emitting element; and then the resultant substrate is shipped.

The transporting chamber 401 is one for transporting the substrate to each chamber by using the transporting mechanism 402 when each gate provided between respective chambers is opened. The loading chamber 403 is one for setting (installing) the substrate. The loading chamber may be separated into a chamber for carrying in the substrate and another chamber for carrying out the substrate, if necessary. The loading chamber 403 comprises an evacuation pump and a purge line for introducing a high-purified nitrogen gas or rare gas. The pretreatment chamber 404 is one for treating a surface of the anode or a cathode (anode in this embodiment mode) for the light emitting element. Specifically, the substrate is heated at a temperature of from 100° C. to 120° C. while irradiating the substrate with an ultraviolet ray in an oxygen atmosphere. Or, the substrate is heated at a temperature of from 200° C. to 400° C. while irradiating the substrate with plasma in an oxygen or hydrogen atmosphere.

The film formation chamber 405 is one for forming an electro-luminescent layer by vapor deposition. An electro-luminescent layer for emitting respective red, blue, and green lights is formed by using a metal mask, if necessary. The electro-luminescent layer is composed by laminating plural layers such as a hole injecting layer, a hole transporting layer, a light emitting layer, an electron transporting layer, and an electron injecting layer with use of various materials. The material changing chamber 413 is one for changing an evaporation material. The material changing chamber is equipped with a heater for heating the material, an evacuation pump, and the like. The film formation chamber 407 is one for forming the electro-luminescent layer by spin coating. The vacuum evacuation chamber 406 is provided between the transporting chamber 401 and the film formation chamber 407, and therefore it is possible to form the electro-luminescent layer under atmospheric pressure (or normal pressure). In the film formation chamber 407, a hole injection layer is mainly formed. Note that, a heating mechanism may additionally be provided to the film formation chamber 407 so as to perform a heat treatment after fabricating the electro-luminescent layer.

The film formation chamber 408 is one for forming a conductor which serves as an anode or a cathode of the light emitting element (the conductor becomes a cathode in this embodiment mode) by vapor deposition. For example, an Al—Li alloy film (an alloy film of aluminum and lithium) is formed. The conductor may be formed by co-depositing aluminum and an element belonging to Group 1 or 2 of the periodic table. Although not illustrated in the drawing, another film formation chamber for forming the conductor by sputtering may be formed. The film formation chamber for sputtering is effective in the case where the anode is formed after forming the electro-luminescent layer on a pixel electrode, which serves as the cathode. During the film formation, the inside of the film formation chamber maintains an argon atmosphere added with oxygen such that the concentration of oxygen in the film is controlled. Consequently, a low-resistance film having high light transmitting properties can be formed. It is desirable that each film formation chamber be isolated from the transporting chamber with a gate.

The sealing chamber 409 is one for sealing the light emitting element into a hermetically enclosed space. The sealing treatment is carried out for the purpose of protecting the light emitting element from moisture. The light emitting element may be sealed by using a method for mechanically sealing the light emitting element with a cover member, a method for sealing the light emitting element with a thermosetting resin or a ultraviolet ray curable resin, a method for sealing the light emitting element with a thin film having high barrier function such as metal oxide and nitride, and the like. The cover member may be formed of glass, ceramic, plastic, or metal. In the case where light is emitted toward the cover member, the cover member must have the light transmitting properties. The cover member is adhered to the substrate over which the light emitting element formed with a sealing agent such as the thermosetting resin and the ultraviolet ray curable resin. The sealing agent is cured by heating or irradiating with a ultraviolet ray so as to form the hermetically enclosed space. It is effective that a hygroscopic substance represented by barium oxide is provided in the hermetically enclosed space. Further, it is possible to fill a gap between the cover member and the substrate with the light emitting element formed thereon with the thermosetting resin or the ultraviolet ray curable resin. In this case, it is also effective that the hygroscopic substance represented by barium oxide is added to the thermosetting resin or the ultraviolet ray curable resin.

The bonding chamber 410 is one for adhering an adhesive tape such as a TAB tape and a FPC (flexible printed circuit), in which pressure bonding is carried out, if necessary. Preferably, the bonding chamber comprises a CCD camera such that the adhesive tape is adhered to a predetermined portion of the substrate by recognizing an alignment marker with use of the CCD camera to correct the displacement. Other than bonding the adhesive tape to the substrate, the substrate may be mounted with an IC by using a wire bonding method or a flip chip method. Alternatively, the substrate may be mounted with a flip chip by the COG (chip on glass) method.

The heating chamber 411 is one for heating the light emitting element. The heating treatment is performed at 100° C. or more such that moisture among the atmospheric air is changed to a liquid state other than a gaseous state. The heating treatment is carried out before and after applying reverse bias voltage to the light emitting element.

The processing chamber 414 is one for insulating short-circuit portions between the anode and the cathode. The inside of the processing chamber is maintained at a temperature of from −40° C. to 8° C. When the reverse bias voltage is applied to the light emitting element, electric current locally flows only through the short-circuit portions between the anode and the cathode, and the short-circuit portions generate heat. Therefore, the short-circuit portions are oxidized and then insulated. Upon application of the reverse bias voltage to the light emitting element, only the short-circuit portions generate heat. However, moisture residing in the atmospheric air can penetrate into the short-circuit portions, which promotes the deterioration of the light emitting element. On the other hand, since the reverse bias voltage is applied to the light emitting element at a temperature of from −40° C. to 8° C. in the present invention, moisture exists in a solid state having a fixed shape and volume. That is, since moisture in the atmospheric air exists in the solid state, when the short-circuit portions generate heat, moisture does not penetrate into the light emitting element, thereby preventing the deterioration of the light emitting element.

The delivery chamber (pass box) 412 is provided in order not to expose the resultant substrate to the outside air directly, which comprises a transporting chamber. The resultant substrate is taken out of the manufacturing apparatus via the delivery chamber.

The manufacturing apparatus of the invention comprises at least film formation chambers for the electro-luminescent layer and an opposing electrode, and a processing chamber for applying the reverse bias voltage. It is also preferable that the sealing chamber and the bonding chamber be additionally provided for the purpose of reducing manufacturing time. Besides the above-mentioned chambers, for example, a chamber for dividing one resultant substrate with a plurality of panels formed thereon may additionally be provided.

Figure 12A:
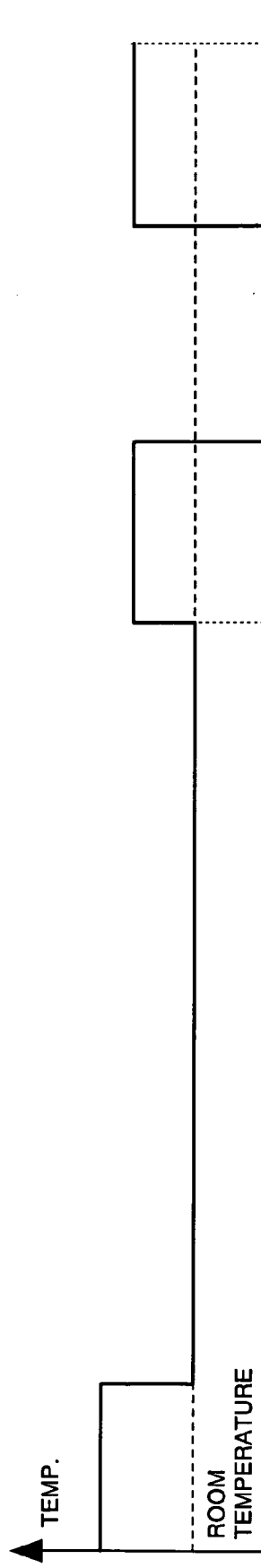
FIGS. 12A and 12B are diagrams explaining a method of manufacturing a display device according to the invention.
Figure 12B:
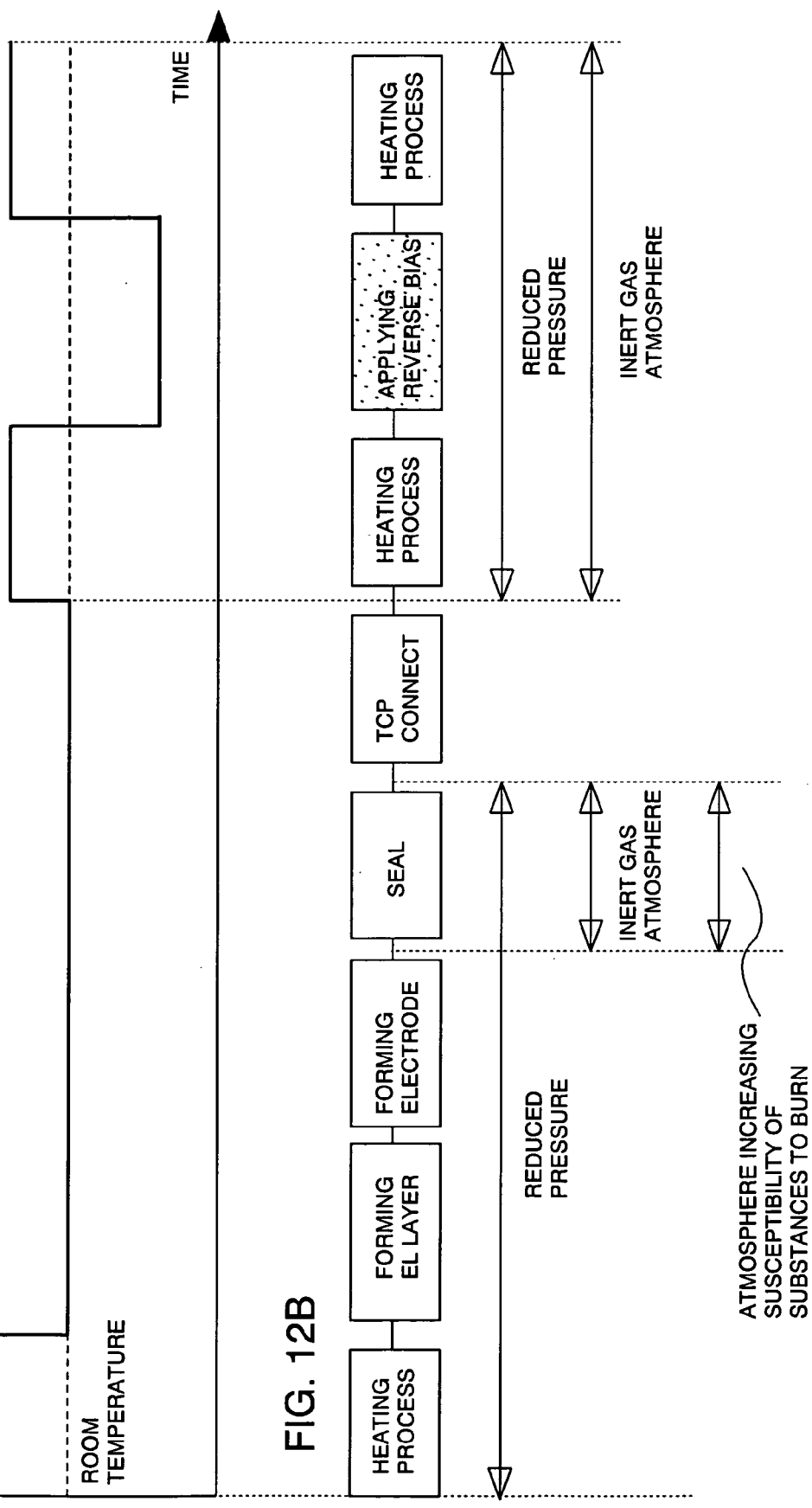

FIG. 12A and FIG. 13A are diagrams showing variation in temperatures in each step, wherein a longitudinal axis denotes temperature and a horizontal axis denotes time. FIG. 12B and FIG. 13B are flow charts showing each step. As set forth above, the treatment for applying the reverse bias voltage may be performed any time if the light emitting element has been completed. FIGS. 12A and 12B show a case in which the reverse bias voltage is applied to the light emitting element after sealing the light emitting element. Meanwhile, FIGS. 13A and 13B shows a case in which the reverse bias voltage is applied to the light emitting element after completing the light emitting element. As illustrated in the drawings, in order to prevent the ingress of a substance promoting the deterioration of the light emitting element, the light emitting element is preferably sealed under an inert atmosphere such as argon gas, under an atmosphere of a gas, which increase the susceptibility of substances to burn, such as oxygen gas, and under reduced pressure. Similarly, the heat treatment is preferably carried out under an inert gas atmosphere and under reduced pressure. The embodiment mode is a good reference as the explanation related to the manufacturing apparatus of the invention and to the method of manufacturing the display device of the invention.

By making use of the above-mentioned manufacturing apparatus, the short-circuit portions between the anode and the cathode are insulated. Accordingly, when a display device, which can display images favorably and prevent the intrusion of moisture upon electrical isolation of the short-circuit portions, is manufactured, the display device can be subjected to plural treatments in succession, thereby reducing manufacturing time and manufacturing costs.

Embodiment 1

In Embodiment 1, a structure of a display device according to the present invention will be explained with reference to FIGS. 3A to 3C, and FIGS. 4A to 4D. That is, a structure of a display device, in which short-circuit portions between an anode and a cathode for a light emitting element are insulated, will be described referring to the drawings.

Figure 3A:
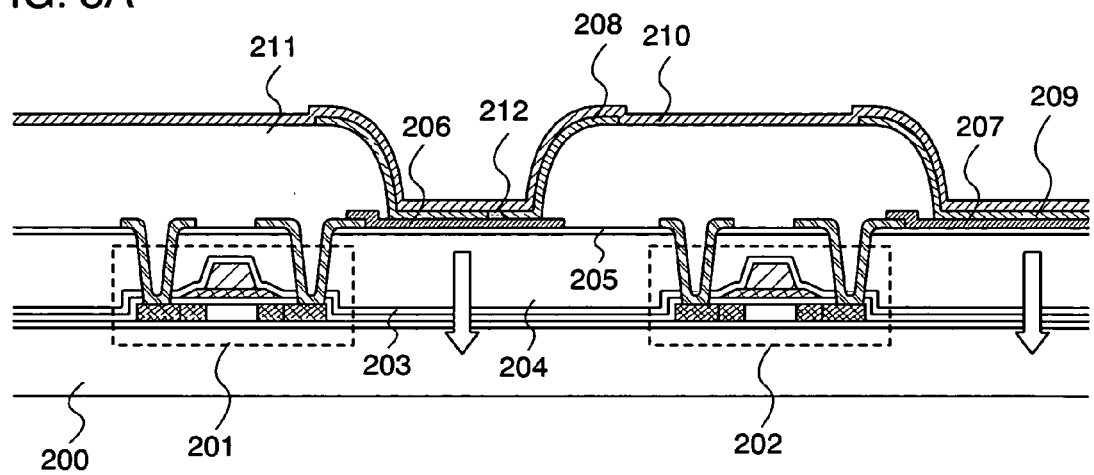
FIGS. 3A to 3B are cross sectional views of a display device according to the invention.
Figure 3B:
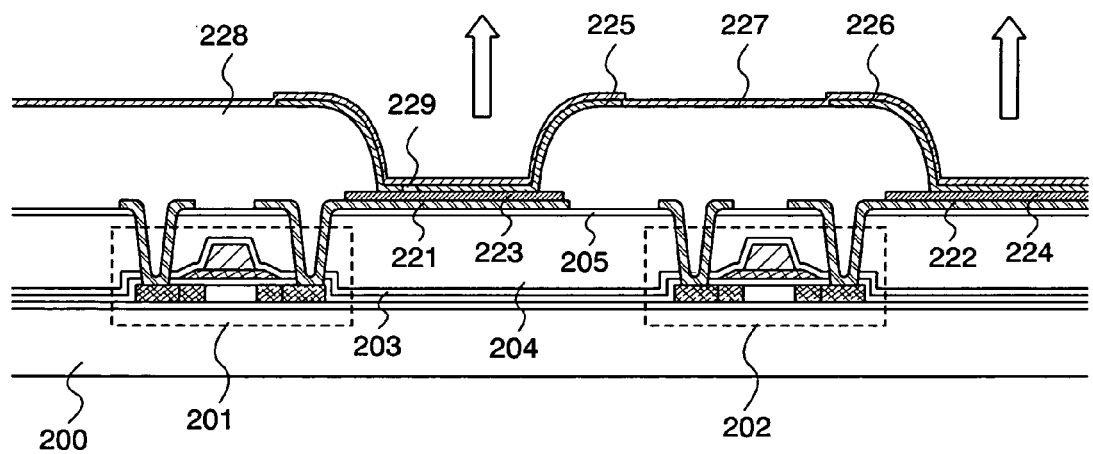

FIGS. 3A and 3B are cross sectional views of an active matrix light emitting display device including a light emitting element and a thin film transistor in each pixel. More specifically, FIGS. 3A and 3B show cross sectional structures of thin film transistors 201 and 202 formed over a substrate 200. These thin film transistors are top-gate thin film transistors each of which includes a polycrystalline semiconductor (polysilicon (p-Si)) in a channel portion.

Insulators 203 to 205 are formed on the thin film transistors 201 and 202. The insulators 203 to 205 are formed by using a material containing silicon such as a silicon oxide film, a silicon nitride film, a silicon nitride oxide film, and a silicon oxynitride film; an organic material such as acrylic, benzocyclobutene, parylene, flare, and light-transmitting polyimide; a compound material formed by polymerization such as siloxane polymer; and the like. It is preferable that the insulator 204 be formed of the organic material or the compound material. Since the insulator 204 composed of the organic material is superior in flatness, when a conductor is formed in a subsequent step, the film thickness of the conductor is not extremely thin or the conductor is not disconnected in a step difference. Therefore, it is preferable that the insulator 204 be formed of the organic material. In order to prevent degasification, the insulator 204 formed of the organic material is preferably sandwiched between thin films formed of an inorganic material containing silicon. Concretely, a silicon nitride oxide film, a silicon nitride film, and the like are preferably formed as the thin inorganic films by plasma CVD, sputtering, etc. Accordingly, the insulators 203 and 205, which sandwich the insulator 204, are preferably formed of the inorganic material containing silicon. The siloxane polymer is mentioned as a representative example of a material having a skeleton structure composed by bonding silicon and oxygen and containing at least hydrogen in substituent; or a material including at least any one of fluorine, alkyl group, and aromatic hydrocarbon in substituent. Also, any materials fulfilling the conditions set forth above can be employed, besides siloxane polymer. The siloxane polymer is superior in flatness, and has light-transmitting properties and heat resistant properties. After forming an insulator composed of siloxane polymer, a heat treatment can be carried out at a temperature of about from 300° C. to 600° C. or less. By performing the heat treatment, for instance, a hydrogenation treatment and a baking treatment can simultaneously be performed.

Next, when the thin film transistors 201 and 202 are P-type transistors, a case of emitting light generated from the light emitting element toward a substrate 200 and a case of emitting light toward the direction opposite to the substrate 200 will be described with reference to FIGS. 3A and 3B.

First, the case of emitting light toward the substrate 200 will be described with reference to FIG. 3A. In this case, anodes 206 and 207, electro-luminescent layers 208 and 209, and a cathode 210 are sequentially laminated so as to be electrically connected to the respective thin film transistors 201 and 202. The cathode 210 can be formed of a known material if it is a light-transmitting conductive film having low work function. For example, the cathode is desirably formed of Ca, Al, CaF, MgAg, AlLi, and the like. The electro-luminescent layers 208 and 209 may be a single-layer structure, a lamination-layer structure, or a mixed-layer structure having no interface between layers. Further, the electro-luminescent layers 208 and 209 may be formed of a singlet luminescent material, a triplet luminescent material, or a material which is in a combination of the above mentioned materials. In addition, an organic material including a low molecular weight material, a high molecular weight material, and an intermediate molecular weight material; an inorganic material, which is superior in a hole injecting property represented by molybdenum oxide etc.; and a hybrid material of the organic material and the inorganic material may be used for the electro-luminescent layers. In the case where the electro-luminescent layers 208 and 209 have lamination-layer structures, a hole injecting layer, a hole transporting layer, a light emitting layer, an electron transporting layer, and an electron injecting layer are laminated in this order on the anodes 206 and 207.

The anodes 206 and 207 are formed of a transparent conductive film, which can transmit light, respectively. For example, a transparent conductive film in which 2 to 20% zinc oxide (ZnO) is mixed into indium oxide, is employed, besides ITO. A partition wall 211 is formed of a material including silicon, an organic material, or a compound material as well as the insulators 203 to 205. It is favorable that the partition wall 211 be formed of a photosensitive or nonphotosensitive material such as acrylic and polyimide since the curvature radius of the side surface for the partition wall is gently varied and the electro-luminescent layers are not disconnected. Light generated from the light emitting element having the above-mentioned structure is emitted toward the substrate 200 as denoted by an arrow in FIG. 3A.

Figure 3C:
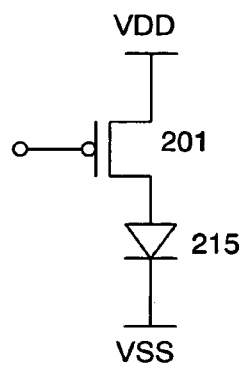
FIG. 3C is an equivalent circuit diagram thereof.

The case of emitting light toward the direction opposite to the substrate 200 will be described with reference to FIG. 3B. Wirings 221 and 222 each of which is electrically connected to respective thin film transistors 201 and 202, anodes 223 and 224, electro-luminescent layers 225 and 226, and a cathode 227 are laminated in this order over the substrate. In accordance with the above-mentioned structure, when light transmits through the anodes 223 and 224, the light is reflected by the wirings 221 and 222. The cathode 227 may be formed of a known material if it is a conductive film having low work function as well as the case set forth above. Note that, the film thickness of the cathode is thinly set so as to transmit light there through. For instance, aluminum having a thickness of 20 nm can be used as the cathode. The electro-luminescent layers 225 and 226 may have a single-layer structure, a lamination-layer structure, or a mixed-layer structure as well as the above-mentioned case. A partition wall 228 may be formed of the material containing silicon, the organic material, the inorganic material and the like. Although the anodes 223 and 224 are not necessary to transmit light, they are formed of the transparent conductive film as well as the above-described case. FIG. 3C shows an equivalent circuit diagram of the P-type driving thin film transistor 201 and the light emitting element 215 as illustrated in FIG. 3A.

In the cross sectional structures as illustrated in FIGS. 3A and 3B, insulators 212 and 229 disposed between the anode and the cathode are insulated by being applied with the reverse bias voltage.

Figure 4A:
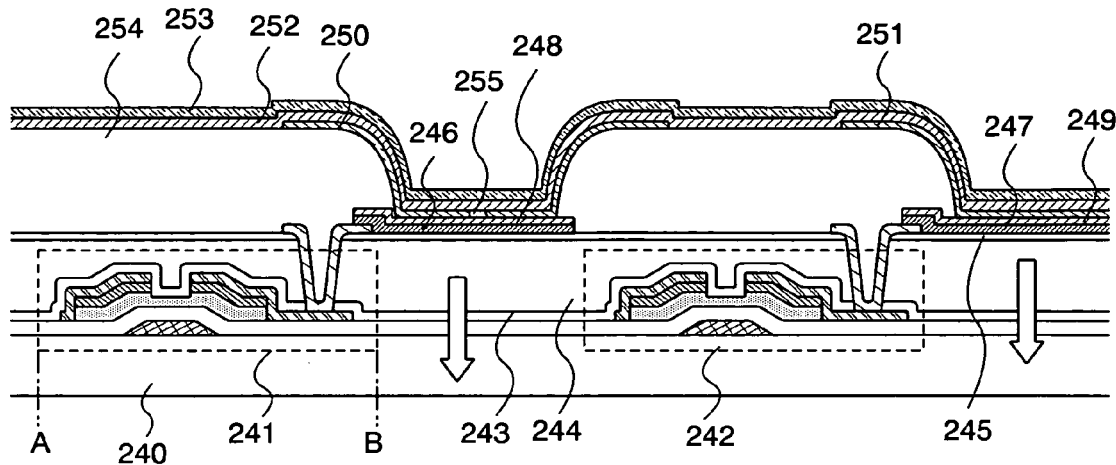
FIGS. 4A and 4B are cross sectional views of a display device according to the invention.
Figure 4B:
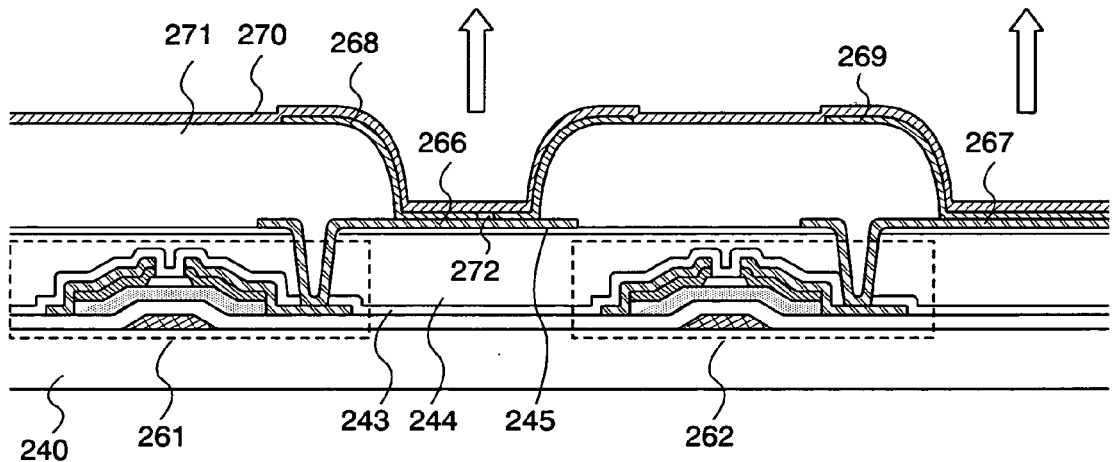

FIGS. 4A and 4B show cross sectional structures of an active matrix light emitting display device including a light emitting element and a thin film transistor in each pixel. More specifically, FIGS. 4A and 4B shows cross sectional structures of thin film transistors 241, 242, 261, and 262, which are formed over the substrate 240. In FIG. 4A, the thin film transistors 241 and 242 are channel etched thin film transistors including an amorphous semiconductor (amorphous silicon (a-Si)) in each channel portion. Meanwhile, in FIG. 4B, the thin film transistors 261 and 262 are channel protection type thin film transistors including the amorphous semiconductor in each channel portion.

As shown in FIGS. 4A and 4B, insulators 243 to 245 are formed on the respective thin film transistors 241, 242, 261, and 262. The insulators 243 to 245 are formed of a material including silicon, an organic material, and a compound material. When the thin film transistors 241, 242, 261, and 262 are N-type transistors, there are a case in which light generated from the light emitting element is emitted toward the substrate 240, and another case in which light is emitted toward a direction opposite to the substrate 240. These cases will be explained with reference to FIGS. 4A and 4B.

First, the case of emitting light toward the substrate 240 is described referring to FIG. 4A. In this case, transparent conductive films 246 and 247 being electrically connected to the thin film transistors 241 and 242, cathodes 248 and 249, electro-luminescent layers 250 and 251, an anode 252, and a light shielding film 253 are laminated in this order. The cathodes 248 and 249 are formed of a known material if it is a conductive film having low work function as well as the cases as set forth above. Note that the film thickness of each cathode is set so as to transmit light there through. The electro-luminescent layers 250 and 251 may have the single-layer structure, the lamination-layer structure, or the mixed structure. A partition wall 254 may also be formed of any materials such as the material containing silicon, the organic material, and the compound material. Although the anode 252 is not necessary to transmit light, it can be formed of the transparent conductive film as set forth above. The light shielding film 253 can be, for example, formed of metal, which reflect light, and the like. However, the material for the light shielding film is not limited thereto. For example, a resin added with a black pigment etc. can be employed.

Figure 4C:
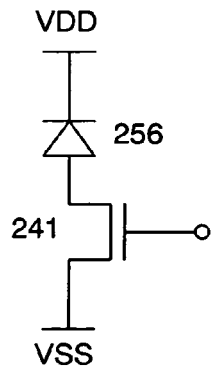
FIG. 4C is an equivalent circuit diagram thereof.
Figure 4D:
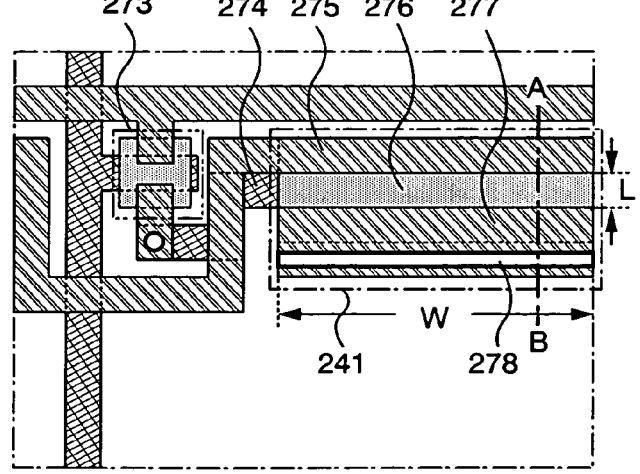
FIG. 4D is a top view thereof.

FIG. 4D is a top view of one pixel including a switching transistor 273 and the thin film transistor 241. FIG. 4A corresponds to a cross sectional view taken along a line A-B of FIG. 4D. The thin film transistor 241 comprises a conductor 274 corresponding to a gate electrode, an amorphous semiconductor 276, and source and drain wirings 275 and 277. A contact hole 278 serves as an opening for connecting a wiring, which is connected to the transparent conductive film 246 functioning as a pixel electrode, to the source or drain wirings 277.

Next, the case of emitting light toward the direction opposite to the substrate 240 will be described referring to FIG. 4B. In this case, cathodes 266 and 267 being electrically connected to the respective thin film transistors 261 and 262, electro-luminescent layers 268 and 269, and an anode 270 are laminated in this order. The cathodes 266 and 267 can be formed of a known material if it is a conductive film having a low work function, which reflects light. The electro-luminescent layers 268 and 269 may be the single-layer structure, the lamination-layer structure, or the mixed-layer structure as set forth above. In the case where the electro-luminescent layers 268 and 269 are composed of a plurality of layers, each electro-luminescent layer is generally formed by laminating an electron injecting layer, an electron transporting layer, a light emitting layer, a hole transporting layer, and a hole injecting layer in this order over the respective cathodes 266 and 267. A partition wall 271 may be formed of any materials such as the material containing silicon, the organic material, and the compound material. The anode 270 is formed of a transparent conductive film, which transmit light. Note that, FIG. 4C is an equivalent circuit diagram of the N-type driving thin film transistor 241 and a light emitting element 256 as illustrated in FIGS. 4A and 4B.

In the cross sectional structures as illustrated in FIGS. 4A and 4B, insulators 255 and 272 between each anode and cathode are insulated by being applied with the reverse bias voltage.

When the transistor having a channel portion formed of the amorphous semiconductor is used as a driver transistor for driving the light emitting element as illustrated in FIGS. 4A and 4B, it is preferable to set a following condition from a viewpoint of the current driving capability of the transistor: channel width W/channel length L=1 to 100 (preferably, 5 to 20). Concretely, it is favorable that the channel length be set to from 5 to 15 μm, and the channel width be set to from 20 to 1,200 μm (more preferably, 40 to 600 μm). When the channel width W and channel length L is set to the above-mentioned condition, an occupied area of the transistor in the pixel is increased. Therefore, it is preferable to carry out a top-emission, in which the light emitting element emits light toward the direction opposite to the substrate.

Light generated from the light emitting element is emitted toward the substrate or toward the direction opposite to the substrate in the above-described cross sectional structures. However, the present invention is not particularly limited thereto. When both the anode and cathode are formed of light-transmitting materials or formed so as to have film thicknesses which are capable of transmitting light, it is possible to achieve dual emission, in which light is emitted both toward the substrate and toward the direction opposite to the substrate. The substrate with elements formed thereon may be formed of any flexible substrate typified by a glass substrate, a quartz substrate, a metal substrate, a bulk semiconductor substrate, and a plastic substrate. In the case of using the plastic substrate, it is preferable to use the following method: elements are formed over a glass substrate once, the elements are separated from the glass substrate by a physical means, and then the separated elements are adhered to the plastic substrate.

Although the transistors having channel portions formed of the polycrystalline semiconductor or the amorphous semiconductor are explained above, the present invention is not limited to these materials. Alternatively, the channel portions of the transistors may be formed of a semi-amorphous semiconductor (hereinafter, referred to as a SAS) in which crystal grains are dispersed in an amorphous semiconductor. The transistor using the SAS has the electron field-effect mobility of 2 to 10 $cm^2/V \cdot sec$, which is 2 to 20 times as large as that of the transistor using the amorphous semiconductor, and has an intermediate structure between an amorphous structure and a crystalline structure (including a single crystal and poly crystal). The SAS further includes a third condition that is stable in terms of free energy, and a crystalline region having short-range order along with lattice distortion. Therefore, the crystal grains having a grain size of from 0.5 to 20 nm can be diffused in the amorphous semiconductor. Further, the SAS is added with hydrogen or halogen of at least 1 atom % or more as a neutralizing agent for dangling bonds. The more favorable and stable SAS can be obtained by being added with a rare gas element such as helium, argon, krypton, and neon to promote the lattice distortion. Such SAS is disclosed in, for example, U.S. Pat. No. 5,744,818.

The present embodiment can be freely combined with the above-mentioned embodiment modes.

Embodiment 2

Figure 5A:
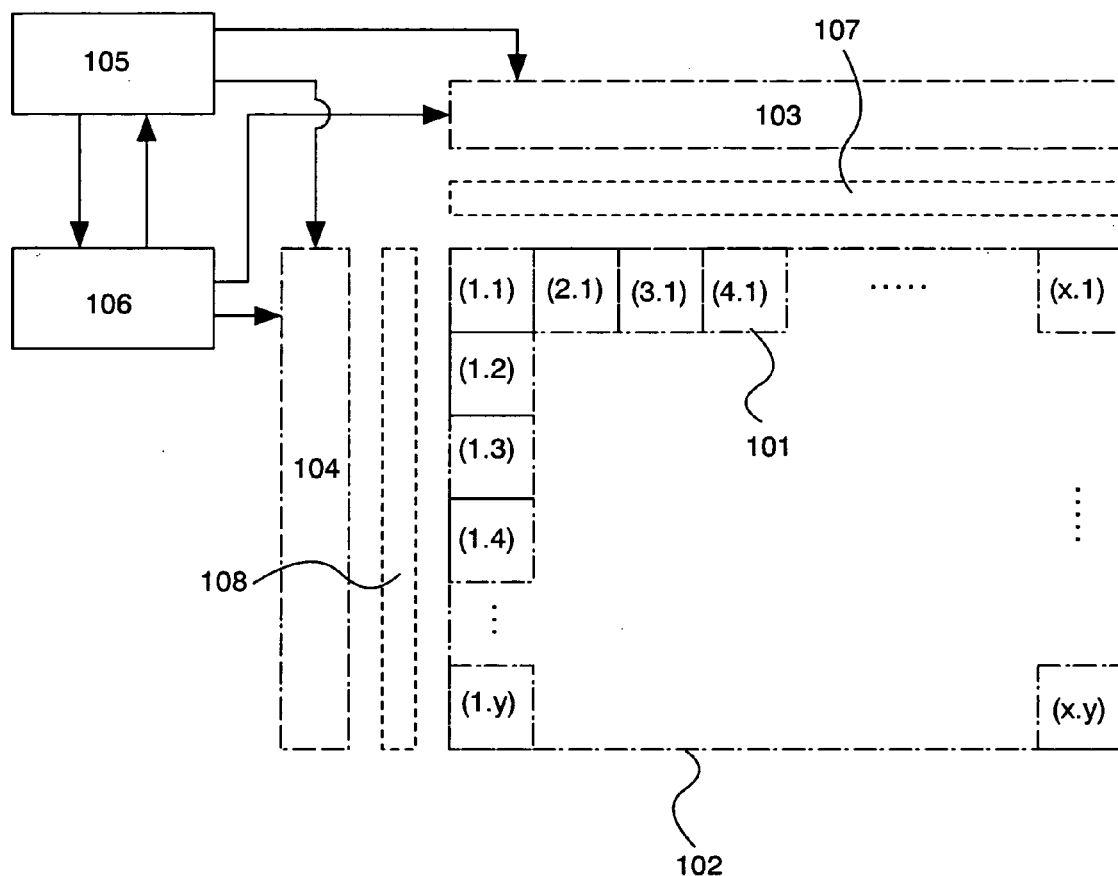
FIGS. 5A and 5B are circuit diagrams of a display device according to the invention.

A structure for a display device according to the present invention will be describe referring to FIGS. 5A and 5B, and FIGS. 6A to 6D. FIG. 5A shows a simple overview of the display device. The display device comprises a pixel potion 102, which includes a plurality of pixels 101 arranged in matrix; and a signal line driver circuit 103, a scanning line driver circuit 104, a protection circuits 107 and 108 in the periphery of the pixel portion 102. The display device further includes a controller 105 and a power supply circuit 106. The controller 105 supplies a clock, a clock back, a start pulse, and a video signal to the signal line driver circuit 103 and the scanning line driver circuit 104. The power supply circuit 106 supplies power to a panel, and is connected specifically to a power supply line, which is disposed in the pixel portion 102. The power supply line is also referred to as an anode line or a cathode line. The anode line has the same potential as a high potential voltage VDD and the cathode line has the same potential as a low potential voltage VSS.

Each of the plurality of pixels 101 comprises a light emitting element including an electro-luminescent material sandwiched between a pair of electrodes. A first electrode of the light emitting element is connected to the anode line, whereas a second electrode thereof is connected to the cathode line. According to the invention, potentials of the anode line and the cathode line are switched with each other, and thus a reverse bias voltage is applied to the light emitting element at a temperature of from −40° C. to 8° C. The timing of applying the reverse bias voltage to the light emitting element is determined by a predetermined signal supplied into the power supply circuit 106 from the controller 105.

The protection circuits 107 and 108 are composed of one or a plurality of elements selected from a resistive element, a capacitor, a diode, a transistor, and the like. For example, it is preferable to provide protection circuits having a following structure for each wiring line: four diodes connected in series are used, and one end of the connected diodes is connected to a high potential power source and another end thereof is connected to a low potential power source.

Figure 5B:
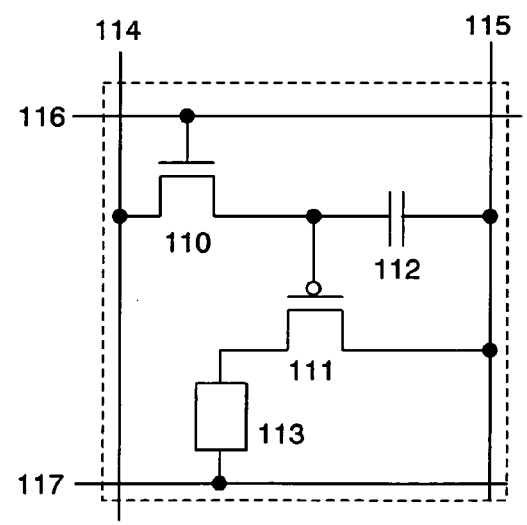

FIG. 5B is an equivalent circuit diagram of one of the plurality of pixels 101. One of the plurality of pixels 101 includes a transistor 110 for controlling input of a video signal to the pixel 101, a transistor 111 for controlling the current value flowing between electrodes of a light emitting element 113, and a capacitor element 112 for storing a gate-source voltage of the transistor 111 in a region surrounded by a signal line 114, power supply lines 115 and 117, a scanning line 116. Although the pixel includes the capacitor element 112 in FIG. 5B, the invention is not limited thereto. When a gate capacitance of the transistor 111 can serve as a capacitor for holding the gate-source voltage, the capacitor element 112 is not necessarily provided.

Figure 6A:
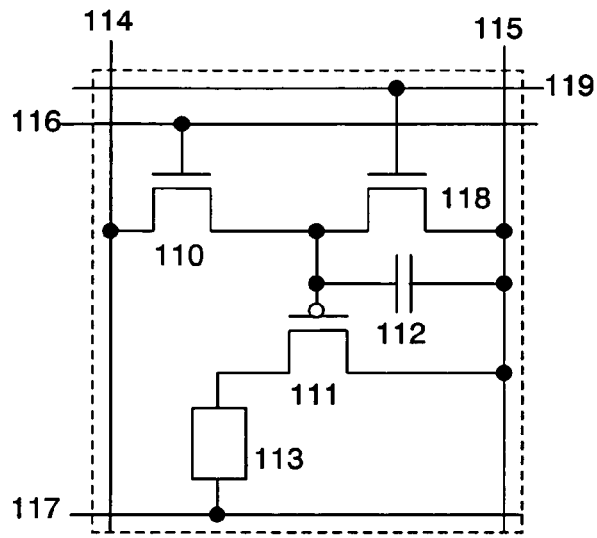
FIGS. 6A to 6D are equivalent circuit diagrams of a display device according to the invention.

FIG. 6A is an equivalent circuit diagram having a structure in which a transistor 118 and a scanning line 119 are additionally provided in the one of the plurality of pixels 101 illustrated in FIG. 5B. When the transistor 118 turns ON, the electric charge stored in the capacitor element 112 is discharged to turn OFF the transistor 111. By providing the transistor 118, supply of the electric current to the light emitting element 113 can be forcibly stopped. Accordingly, a lighting period can start simultaneously with or immediately after a writing period stars before signals are written into all the pixels, thereby improving the duty ratio. In particular, moving images can favorably be displayed in accordance with the configuration.

In the one of the plurality of pixels 101 in which the signal line 114 and the power supply line 115 are connected via the transistors as shown in FIG. 6A, however, when a reverse bias voltage is applied to the light emitting element 113, the transistors 110 and 118 are turned ON due to the gate-source voltage, and therefore, the power supply line 115 can be shorted to a signal line driver circuit 103. In order to prevent such short-circuit, it is preferable that reverse bias voltage applying circuits are provided for the signal line driver circuit 103 and the scanning line driver circuit 104, respectively.

Figure 6B:
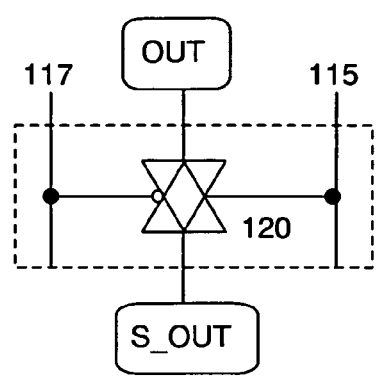

A configuration of a reverse bias voltage applying circuit provided to the signal line driver circuit 103 will be described with reference to FIG. 6B. The reverse bias voltage applying circuit comprising an analog switch 120 in FIG. 6B is provided according to each signal line 114. Gate electrodes of two transistors, which constitute the analog switch 120, are connected to the power supply lines 115 and 117, respectively.

Figure 6C:
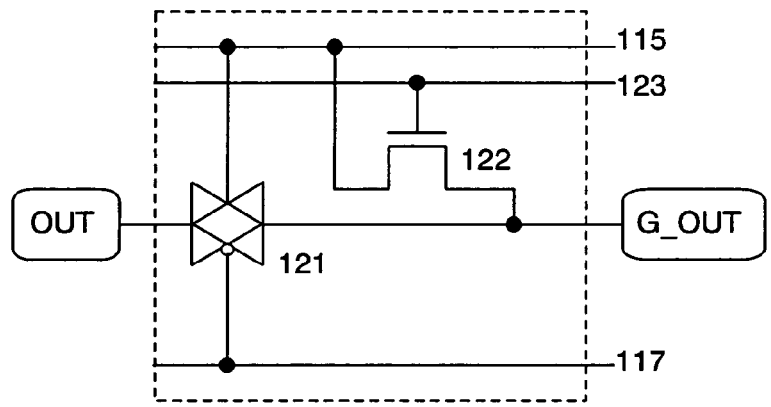
Figure 6D:
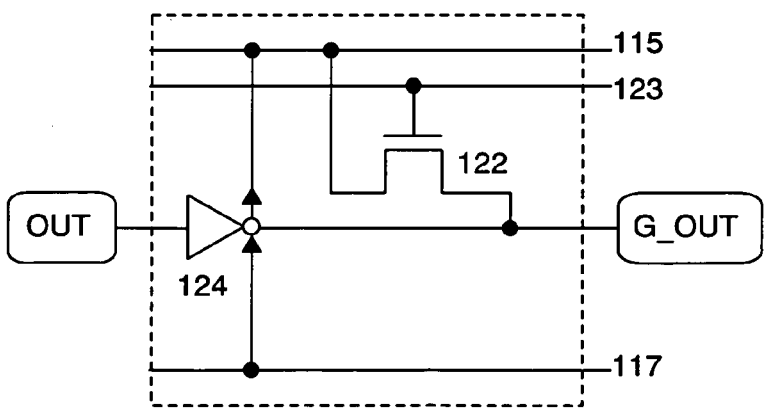

Configurations of reverse bias voltage applying circuits provided to the scanning line driver circuit 104 will be described referring to FIGS. 6C and 6D. Each reverse bias voltage applying circuit in FIGS. 6C and 6D is provided according to each scanning line. The scanning line mentioned here corresponds to a wiring in which the gate electrodes for the transistors arranged between the signal line 114 and the power supply line 115 are connected to each other. In one pixel shown in FIG. 6A, the scanning line corresponds to the scanning lines 116 and 119.

The reverse bias voltage applying circuit in FIG. 6C comprises an analog switch 121, a reverse bias transistor 122, and a wiring 123. Meanwhile, the reverse bias voltage applying circuit as illustrated in FIG. 6D comprises a clocked inverter 124, a reverse bias transistor 122, and a wiring 123. More specific configurations and operations for the reverse bias voltage applying circuits as illustrated in FIGS. 6B to 6D are disclosed in Japanese Patent Application No. 2003-275723.

Figure 7A:
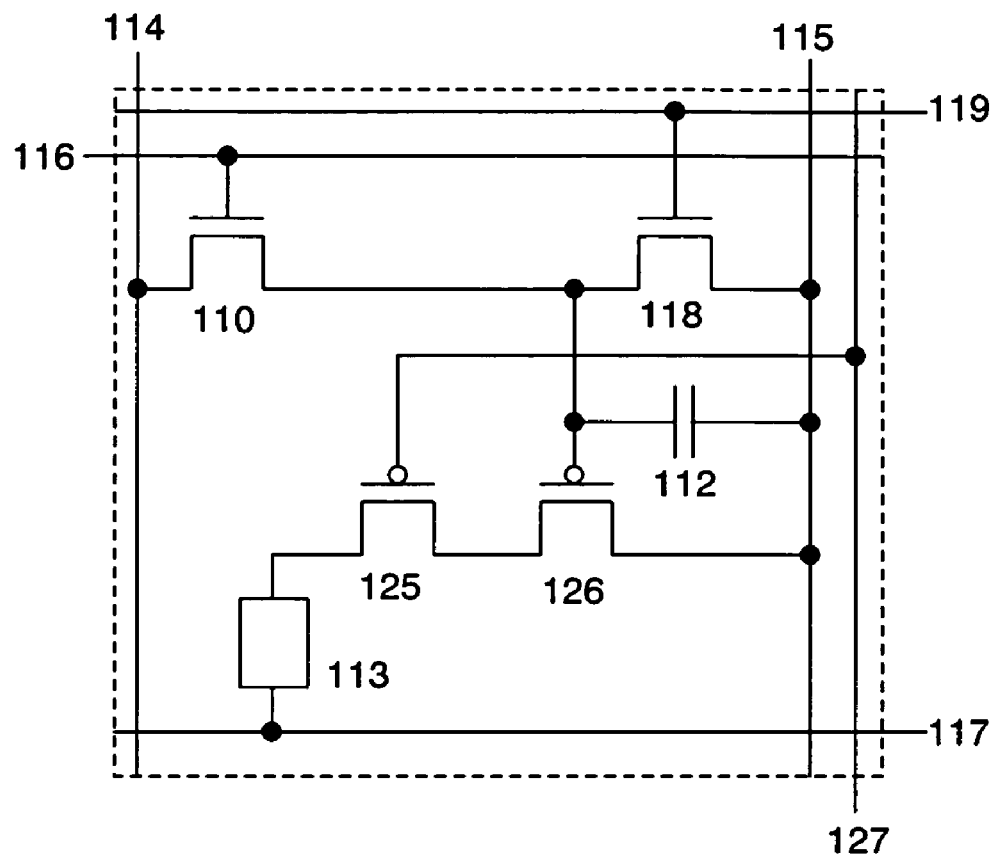
FIGS. 7A and 7B are circuit diagrams of a display device according to the invention.

Subsequently, one of the plurality of pixels 101 having a different structure from those of FIG. 5B and FIG. 6A will be described with reference to FIG. 7A. The pixel in FIG. 7A is one in which transistors 125 and 126, and a wiring 127 are additionally provided in the pixel of FIG. 6A though the transistor 111 is removed. In this configuration, a gate electrode of the transistor 125 is connected to the wiring 127 storing a constant voltage such that the electric potential for the gate electrode is fixed. By operating the transistor 125 in a saturation region, electric current can always be flowed through the light emitting element. The transistor 126 is operated in a linear region and connected to the transistor 125 in series. The gate electrode of the transistor 126 is input with video signals for transmitting information about lighting or non-lighting of the pixel via the transistor 110. Since the source-drain voltage $V_{DS}$ for the transistor 126 operated in the linear region is low, slight fluctuation in the gate-source voltage $V_{GS}$ of the transistor 126 does not adversely affect the current value flowing through the light emitting element 113. Accordingly, the amount of the current flowing through the light emitting element 113 is determined by the transistor 125, which is operated in the saturation region. According to the invention having the above-mentioned configurations, luminance fluctuation of the light emitting element 113, which is contributed to fluctuation in the characteristics of the transistor 125, can be improved, thereby enhancing the image quality. The channel length $L_{125}$ and the channel width $W_{125}$ for the transistor 125, and the channel length $L_{126}$ and the channel width $W_{126}$ for the transistor 126 are set so as to satisfy the relation of $L_{125}/W_{125}:L_{126}/W_{126}=5$ to $6,000:1$. For example, there is a case in which the $L_{125}$ is 500 μm, the $W_{125}$ is 3 μm, the $L_{126}$ is 3 μm, and the $W_{126}$ is 100 μm. It is preferable that the transistors 125 and 126 comprise a same conductivity type. Further, the transistor 125 may be either an enhancement transistor or a depletion transistor.

Figure 7B:
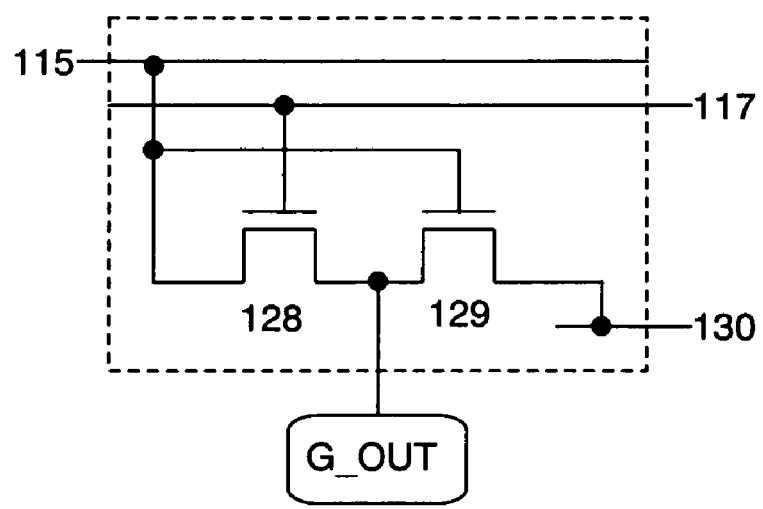

In the case of the pixel comprising the above-mentioned configuration, in order to prevent the short-circuit between the signal line driver circuit 103 and the power supply line 115, the reverse bias voltage applying circuit as shown in FIG. 6B is provided in the signal line driver circuit 103 and the reverse bias voltage applying circuits as shown in FIGS. 6C and 6D are provided in the scanning line driver circuit 104. Note that, in the case of the pixel having the configuration as shown in FIG. 7A, a reverse bias voltage applying circuit as illustrated of FIG. 7B is preferably formed in order to control the wiring 127. The reverse bias voltage applying circuit in FIG. 7B comprises two transistors 128 and 129 connected to each other in series, and a wiring 130. More specific configurations and operations with respect to the reverse bias voltage applying circuit of FIG. 7B are disclosed in Japanese Patent Application No. 2003-278484.

The display device of the invention may use either analog video signals or digital video signals. When the digital video signals are employed, the method of inputting the digital video signals into the display device is varied depending on the case where the video signals use the voltage and the case where the video signals use the electric current. That is, luminescence is emitted from the light emitting element either by inputting the video signals into pixels with constant voltage or by inputting the video signals into the pixels with constant current. The method of inputting video signals with constant voltage includes the one in which constant voltage is applied to the light emitting element and the one in which constant current is flowing through the light emitting element. Further, the method of inputting video signals with constant current includes the one in which constant voltage is applied to the light emitting element and the one in which constant current is flowing through the light emitting element. The driving method in which constant voltage is applied to the light emitting element indicates a constant voltage drive, whereas the driving method in which constant current is flowing through the light emitting element indicates a constant current drive. With respect to the constant current drive, constant current flows regardless of variation in resistance for the light emitting element. The display device and the method of driving thereof according to the invention may employ either video signals using voltage or video signals using electric current. Further, either the constant voltage drive or the constant current drive may be used.

The present invention can be freely combined with the above-mentioned embodiment modes and embodiment.

Embodiment 3

Figure 8A:
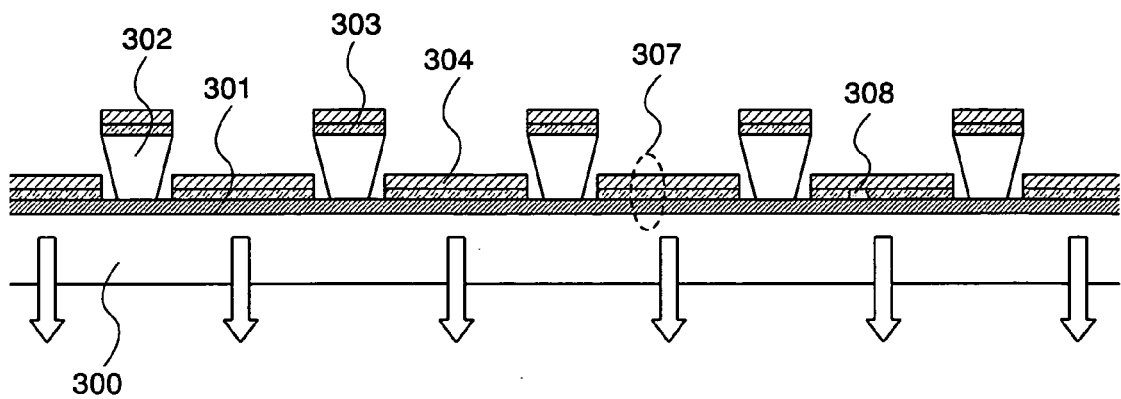
FIG. 8A is a cross sectional view of a display device according to the invention.

A structure of a passive matrix display device according to the present invention will be described with reference to the drawings. FIG. 8A is a cross sectional view. A first electrode 301, which will serve as an anode, is formed on an entire surface of a substrate 300, and partition walls 302 are formed thereon. Electro-luminescent layers 303 and second electrodes 304, which will become cathodes, are formed thereon. Thus, a display device having light emitting elements 307 is completed. An insulator 308 formed between the first electrode 301 and the second electrode 304 is insulated by being applied with a reverse bias voltage.

Figure 8B:
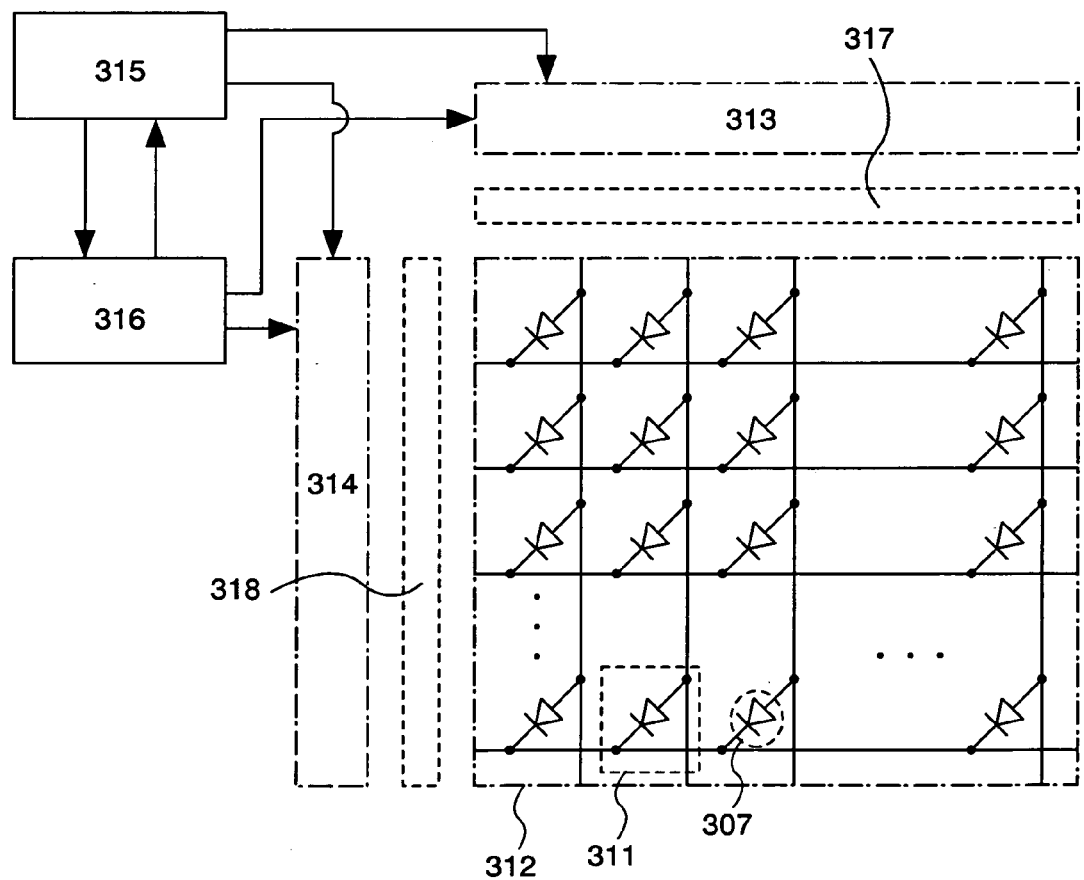
FIG. 8B is a circuit diagram thereof.

The structure of the passive matrix display device will be described in more detail with reference to FIG. 8B. The passive matrix display device comprises a pixel portion in which a plurality of pixels 311 is arranged in matrix; and protection circuits 317 and 318, a column signal line driver circuit 313, a row signal line driver circuit 314 in the periphery of the pixel portion 312. The display device further includes a controller 315, and a power supply circuit 316. As shown in the drawing, one of the electrodes for each of the light emitting elements 307 is connected to one of the signal lines arranged in columns and another electrode is connected to one of the signal lines arranged in rows. The timing of applying the reverse bias voltage to the light emitting elements 307 is determined by supplying a predetermined signal to the power supply circuit 316 from the controller 315. The protection circuits 317 and 318 are composed of one or a plurality of elements selected from a resistive element, a capacitor, a diode, a transistor, and the like, respectively. For example, it is preferable to provide protection circuits having a following structure for each wiring line: four diodes connected in series are used, and one end of the connected diodes is connected to a high potential power source and another end thereof is connected to a low potential power source.

The present embodiment can be freely combined with the above-described embodiment modes and embodiments.

Embodiment 4

Figure 9A:
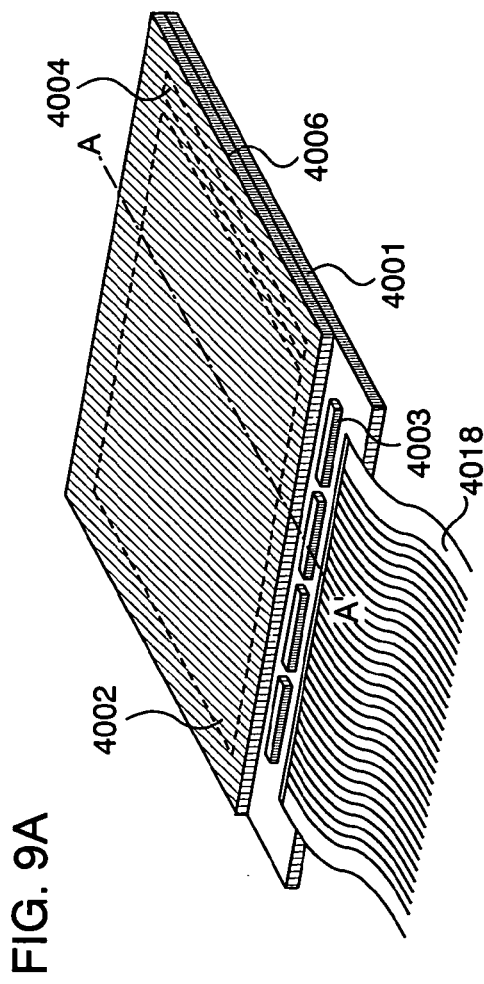
FIG. 9A is a perspective view of a panel, which is one embodiment mode of a display device according to the invention.

An appearance of a panel, which is one embodiment mode of a display device according to the present invention, will be described with reference to FIGS. 9A and 9B. FIG. 9A is a perspective view of the panel, whereas FIG. 9B is a cross sectional view taken along a line A–A' of FIG. 9A.

Figure 9B:
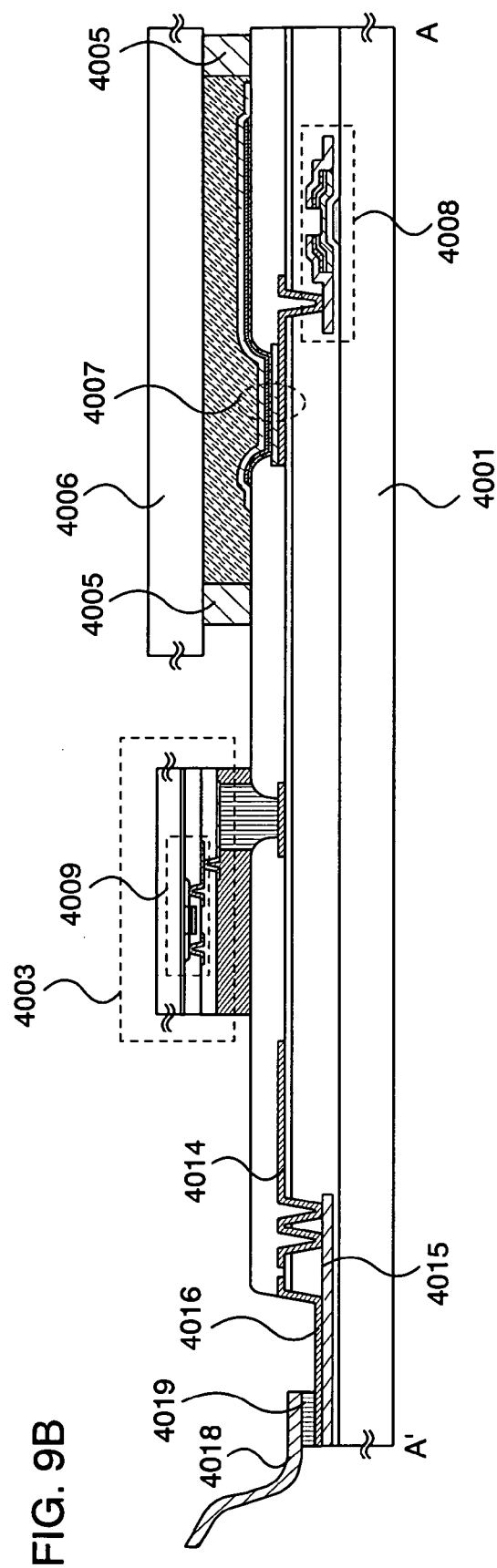
FIG. 9B is a cross sectional view thereof.

The panel as shown in FIGS. 9A and 9B is one in which a pixel portion 4002 and a scanning line driver circuit 4004 formed over a first substrate 4001 are shielded and adhered to a second substrate 4006 with a sealing agent 4005. The pixel portion 4002 includes a light emitting element 4007 and a thin film transistor 4008. The thin film transistor 4008 uses an amorphous semiconductor as a channel portion. A signal line driver circuit 4003 composed of a polycrystalline semiconductor is mounted over another substrate at a region different from a region surrounded by the sealing agent 4005 over the first substrate 4001.

The embodiment will explain an example of adhering the signal line driver circuit 4003 comprising a transistor formed of the polycrystalline semiconductor to the first substrate 4001. Alternatively, a signal line driver circuit comprising a transistor, which is formed of a monocrystalline semiconductor, may be adhered to the first substrate 4001. FIG. 9B exemplifies a transistor 4009 formed of the polycrystalline semiconductor, which is included in the signal line driver circuit 4003. The embodiment shows an example in which the signal lien driver circuit 4003 is separately formed over the second substrate 4006 and then mounted on the first substrate 4001 by adhering to each other. However, the invention is not limited thereto, and a scanning line driver circuit may be separately provided over the second substrate, or a part of the signal line driver circuit or the scanning like driver circuit may be separately formed over the second substrate and then mounted over the first substrate.

Various signals and electric potentials applied to the signal line driver circuit 4003, which is separately formed over the second substrate, the scanning line driver circuit 4004, and the pixel portion 4002 are supplied from a connection terminal 4016 via lead wirings 4014 and 4015. The connection terminal 4016 is electrically connected to a terminal of a FPC (flexible printed circuit) 4018 via an anisotropic conductive film 4019.

The present invention can provide a display device which is capable of displaying images favorably by applying a reverse bias voltage to the light emitting element 4007 to insulate a short-circuit portion between the anode and cathode. Consequently, it is possible to provide a highly reliable display device as a product.

Embodiment 5

In case of an active matrix display device, each pixel comprises a thin film transistor and a light emitting element. A thin film transistor using an amorphous semiconductor as a channel portion has a property in which the electric characteristics (such as threshold voltage, and electron field-effect mobility) are varied with time. The present embodiment focuses on the threshold voltage, and explains a pixel structure including a correction circuit for the threshold voltage.

The correction circuit will be described with reference to FIGS. 14A to 14C. FIG. 14A shows an equivalent circuit diagram, which includes switches 531 and 532 composed of a transistor etc., a transistor 533, and a capacitor element 534. The operations for the correction circuit will be briefly described below.

When the switches 531 and 532 are turned ON (FIG. 14A), electric current (IDS) flows in a direction from the switch 531 toward the transistor 533 and in a direction from the switch 531 toward the capacitor element 534. At this moment, the electric current IDS flows while being separated into I1 and I2 so as to satisfy the relation of IDS=I1+I2. At the moment of flowing the electric current there-through, no electric charge is stored in the capacitor element 534, and the transistor 533 remains turned OFF. Accordingly, I2=0 and IDS=I1. Electric charge is then gradually stored in the capacitor element 534, and potential difference is generated between electrodes of the capacitor element 534. When the potential difference between the electrodes of the capacitor element 534 becomes Vth, the transistor 533 is turned ON to become $I_2>0$. At this time, since the electric current satisfies the relation of IDS=I1+I2, the electric current remains flowing although the amount of I1 is gradually reduced. Meanwhile, the electric charge is continuously stored in the capacitor element 534 until the potential difference between the electrodes becomes VDD. When the potential difference between the electrodes for the capacitor element 534 becomes VDD, the electric current I2 does not flow. Since the transistor 533 remains turned ON, the electric current becomes the relation of IDS=I1.

Subsequently, when the switch 531 is turned OFF (FIG. 14B), the electric charge stored in the capacitor element 534 flows toward the transistor 533 via the switch 532, and then the electric charge is discharged. This operation is repeatedly carried out until the transistor 533 is turned OFF. That is, the electric charge stored in the capacitor element 534 is stored until it becomes a same value as the threshold voltage of the transistor 533.

Therefore, the potential difference between the electrodes of the capacitor element can be set to the same value as the threshold voltage of one transistor. While keeping the gate-source voltage $V_{GS}$ of the transistor as it is, a signal voltage is applied to a gate electrode of the transistor. Thus, the value of $V_{GS}$ stored in the capacitor element added with the signal voltage is input into the gate electrode of the transistor. That is, the transistor applied with the signal voltage is always input with the sum of the threshold value of the transistor plus the signal voltage even if the threshold voltage between the transistors are fluctuated. Accordingly, it is possible to prevent an adverse effect of the fluctuation in the threshold voltage between the transistors.

One example of a pixel circuit using the above-mentioned correction circuit for the threshold voltage will be described with reference to FIG. 14C. A signal line 560 and a power supply line 561 are arranged in columns, and scanning lines 561 to 564 are arranged in rows. In a regions surrounded by the wiring lines, switches 550 to 553, a transistor 554, a capacitor element 555, a light emitting element 556, a scanning line 565, a switch 566, and another capacitor element 567 are formed.

By forming the correction circuit for the threshold voltage in such manner, the variation in the threshold voltage of a transistor for driving the light emitting element can be suppressed. Consequently, the luminance fluctuation caused by the variation in the threshold voltage can be improved, thereby providing a light emitting device which is capable of displaying high-definition images. The correction circuit for the threshold voltage as described in the embodiment is applied to the pixel circuit illustrated in FIG. 5A. Also, the correction circuit for the threshold voltage may be applied to the pixel circuits as illustrated in FIG. 6A and FIG. 7A. In this regard, the correction circuit for the threshold voltage is preferably provided in a driver transistor in which the signal voltage is applied to the gate electrode. The present embodiment can be implemented by being freely combined with the above-mentioned embodiment modes and embodiments.

Embodiment 6

Examples for electronic appliances typically include a digital camera; an audio reproduction device such as a car audio; a personal laptop computer; a game machine; a portable information terminal (such as a cellular phone, and a portable game machine); an image reproduction device having a recording medium such as a domestic game machine; and the like. Practical examples thereof are shown in FIGS. 10A to 10F.

Figure 10A:
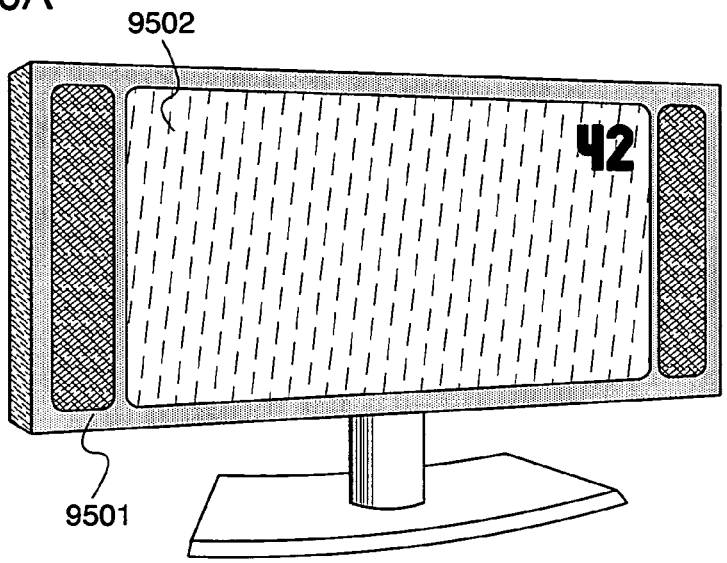
FIGS. 10A to 10F are diagrams showing electronic appliances applied with the present invention.
Figure 10B:
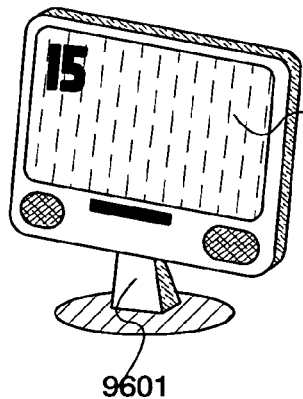
Figure 10C:
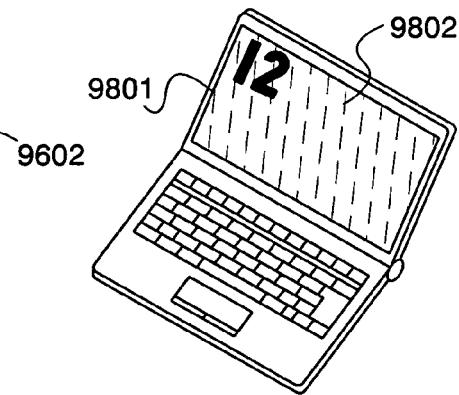
Figure 10D:
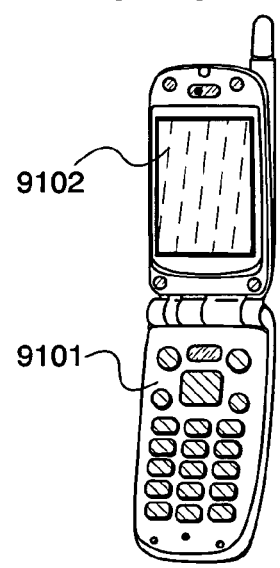
Figure 10E:
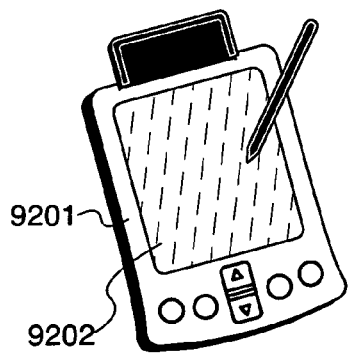
Figure 10F:
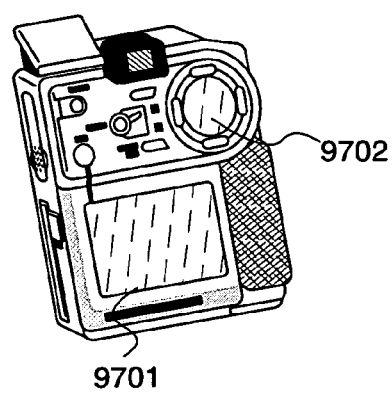

FIG. 10A is a TV set, which comprises a housing 9501, a display portion 9502, and the like. FIG. 10B is a monitor for a personal computer, which comprises a housing 9601, a display portion 9602, and the like. FIG. 10C is a personal laptop computer, which comprises a housing 9801, a display portion 9802, and the like. FIG. 10D is a cellular phone of the portable information terminal, which comprises a housing 9101, a display portion 9102, and the like. FIG. 10E is a personal digital assistance (PDA) of the portable information terminal, which comprises a housing 9201, a display portion 9202, and the like. FIG. 10F is a video camera, which comprises display portions 9701 and 9702, and the like.

In the foregoing electronic appliances, the present invention is applicable to the fabrication of the display portions.

The manufacturing apparatus of the invention is preferably used for manufacturing the display portions for the electronic appliances. According to the invention, even if short-circuit defects are formed between an anode and a cathode, the short-circuit portions are insulated by being applied with a reverse bias voltage, and hence, a display device can display images favorably. As a result, highly reliable electronic appliances can be provided as products. The present embodiment can be implemented by being freely combined with the foregoing embodiment modes and embodiments.

The present invention has been fully described by way of embodiment modes and embodiments with reference to the accompanying drawings. As is well known to those skilled in the art, the present invention can be embodied in several forms, and the embodiment modes and its details can be changed and modified without departing from the purpose and scope of the present invention. Accordingly, interpretation of the present invention should not be limited to descriptions mentioned in the foregoing embodiment modes and embodiments. Note that in the structures according to the present invention described above, portions identical to each other are denoted by same reference numerals in the accompanying drawings.

What is claimed is:

1. A method for manufacturing a display device comprising:
   applying a reverse bias voltage to a light emitting element including a light emitting material between an anode and a cathode at a temperature from −40° C. to 8° C. to insulate a short-circuit portion between the anode and the cathode.

2. A method for manufacturing a display device according to claim 1, wherein the display device is incorporated in at least one selected from the group consisting of a TV set, a personal computer, a laptop computer, a cellular phone, a personal digital assistance, and a video camera.

3. A method for manufacturing a display device comprising:
   performing a heat treatment to a light emitting element including a light emitting material between an anode and a cathode under an inert gas atmosphere; and
   applying a reverse bias voltage to the light emitting element at a temperature from −40° C. to 8° C. to insulate a short-circuit portion between the anode and the cathode.

4. A method for manufacturing a display device according to claim 3, wherein the display device is incorporated in at least one selected from the group consisting of a TV set, a personal computer, a laptop computer, a cellular phone, a personal digital assistance, and a video camera.

5. A method for manufacturing a display device comprising:
   performing a first heat treatment to a light emitting element including a light emitting material between an anode and a cathode under an inert gas atmosphere;
   applying a reverse bias voltage to the light emitting element at a temperature from −40° C. to 8° C. to insulate a short-circuit portion between the anode and the cathode; and
   performing a second heat treatment to the light emitting element under an inert atmosphere.

6. A method for manufacturing a display device according to claim 5, wherein the display device is incorporated in at least one selected from the group consisting of a TV set, a personal computer, a laptop computer, a cellular phone, a personal digital assistance, and a video camera.

7. A manufacturing apparatus comprising:
   a film formation chamber for forming at least one of an electro-luminescent layer and an opposing electrode for a light emitting element; and
   a processing chamber for applying a reverse bias voltage to the light emitting element to insulate a short-circuit portion between an anode and a cathode,
   wherein the inside of the processing chamber is kept at a temperature form −40° C. to 8° C. during the applying the reverse bias voltage.

8. A manufacturing apparatus comprising:
   a film formation chamber for forming at least one of an electro-luminescent layer and an opposing electrode of a light emitting element;
   a processing chamber for applying a reverse bias voltage to the light emitting element to insulate a short-circuit portion between an anode and a cathode; and
   a heating chamber for carrying out a heat treatment to the light emitting element,
   wherein the inside of the processing chamber is kept at a temperature from −40° C. to 8° C. during the applying the reverse bias voltage.

9. A manufacturing apparatus comprising:
   a film formation chamber for forming at least one of an electro-luminescent layer and an opposing electrode of a light emitting element over a first substrate;
   a sealing chamber for adhering the first substrate to a second substrate with a sealing agent;
   a processing chamber for applying a reverse bias voltage to the light emitting element to insulate a short-circuit portion between an anode and a cathode; and
   a heating chamber for carrying out a heat treatment to the light emitting element,
   wherein the inside of the processing chamber is kept at a temperature from −40° C. to 8° C. during the applying the reverse bias voltage.

10. A manufacturing apparatus comprising:
    a film formation chamber for forming at least one of an electro-luminescent layer and an opposing electrode over a first substrate;
    a sealing chamber for adhering the first substrate to a second substrate with a sealing agent;
    a bonding chamber for adhering an adhesive tape to a connection terminal formed over the first substrate;
    a processing chamber for applying a reverse bias voltage to the light emitting element to insulate a short-circuit portion between an anode and a cathode; and
    a heating chamber for carrying out a heat treatment to the light emitting element,
    wherein the inside of the processing chamber is kept at a temperature from −40° C. to 8° C. during the applying the reverse bias voltage.

* * * * *